United States Patent
Tam

(10) Patent No.: US 9,241,097 B1
(45) Date of Patent: Jan. 19, 2016

(54) CAMERA MODULE INCLUDING IMAGE SENSOR DIE IN MOLDED CAVITY SUBSTRATE

(71) Applicant: Amazon Technologies, Inc., Reno, NV (US)

(72) Inventor: Samuel Waising Tam, Daly City, CA (US)

(73) Assignee: Amazon Technologies, Inc., Reno, NV (US)

( * ) Notice: Subject to any disclaimer, the term of this patent is extended or adjusted under 35 U.S.C. 154(b) by 80 days.

(21) Appl. No.: 14/040,396

(22) Filed: Sep. 27, 2013

(51) Int. Cl.
*H04N 5/225* (2006.01)
*H01L 31/02* (2006.01)

(52) U.S. Cl.
CPC ........ *H04N 5/2254* (2013.01); *H01L 31/02002* (2013.01)

(58) Field of Classification Search
CPC .................. H04N 5/2254; H05K 2201/2009; H01L 31/02002
USPC ....................... 348/374, 335, 345; 438/65, 64
See application file for complete search history.

(56) References Cited

U.S. PATENT DOCUMENTS

| 7,230,777 | B2 | 6/2007 | Ye |
| 7,525,096 | B2 | 4/2009 | Nakajo et al. |
| 7,884,875 | B2 | 2/2011 | Kwon et al. |
| 7,948,555 | B2 | 5/2011 | Kwon et al. |
| 8,092,102 | B2 | 1/2012 | Shangguan et al. |
| 8,149,321 | B2 | 4/2012 | Ryu et al. |
| 8,223,249 | B2 | 7/2012 | Chang |
| 8,248,514 | B1 | 8/2012 | Chang |
| 8,248,523 | B2 | 8/2012 | Chua et al. |
| 8,405,756 | B2 | 3/2013 | Yano et al. |
| 8,430,579 | B2 | 4/2013 | Tam et al. |
| 2001/0055073 | A1 | 12/2001 | Shinomiya |
| 2002/0180061 | A1 | 12/2002 | Caletka et al. |
| 2003/0016300 | A1* | 1/2003 | Ting .............................. 348/335 |
| 2004/0212719 | A1 | 10/2004 | Ikeda |
| 2005/0024752 | A1 | 2/2005 | Webster |
| 2005/0048692 | A1 | 3/2005 | Hanada et al. |
| 2005/0134721 | A1 | 6/2005 | Ito |
| 2005/0236708 | A1 | 10/2005 | Farnworth et al. |
| 2005/0285973 | A1* | 12/2005 | Singh et al. .................... 348/374 |
| 2008/0170141 | A1 | 7/2008 | Tam et al. |
| 2008/0252771 | A1 | 10/2008 | Wu |
| 2008/0304821 | A1* | 12/2008 | Jeung et al. .................... 396/529 |
| 2009/0016039 | A1 | 1/2009 | Imamura |
| 2010/0053423 | A1 | 3/2010 | Singh |
| 2011/0102667 | A1 | 5/2011 | Chua et al. |
| 2011/0194023 | A1* | 8/2011 | Tam et al. ...................... 348/374 |

(Continued)

OTHER PUBLICATIONS

Chowdhury, et al., "Challenges of Megapixel Camera Module Assembly and Test" Proceedings of 2005 Electronic Components and Technology Conference, pp. 1390-1401.

(Continued)

*Primary Examiner* — Nhan T Tran
(74) *Attorney, Agent, or Firm* — K&L Gates LLP

(57) ABSTRACT

Systems and methods of manufacturing compact camera modules for use in electronic device are provided. These designs may provide small form factor autofocus (AF) camera modules for incorporation into thin mobile devices, such as tablets or smartphones. The camera module includes a flexible tape substrate having an image sensor die wire bonded to an upper side of the substrate and a molded stiffener formed on the lower side of the substrate.

20 Claims, 27 Drawing Sheets

(56) References Cited

U.S. PATENT DOCUMENTS

| | | | |
|---|---|---|---|
| 2011/0267535 A1 | 11/2011 | Seo et al. | |
| 2012/0217607 A1 | 8/2012 | Hanai et al. | |
| 2012/0242883 A1 | 9/2012 | Pavithran et al. | |
| 2012/0276951 A1 | 11/2012 | Webster et al. | |
| 2013/0038783 A1* | 2/2013 | Shimizu et al. | 348/360 |
| 2013/0050571 A1 | 2/2013 | Tam | |
| 2013/0128106 A1 | 5/2013 | Tam et al. | |

OTHER PUBLICATIONS

U.S. Appl. No. 14/040,385, filed Sep. 27, 2013.
U.S. Appl. No. 14/040,400, filed Sep. 27, 2013.
U.S. Appl. No. 14/040,403, filed Sep. 27, 2013.
U.S. Appl. No. 14/040,408, filed Sep. 27, 2013.
Non-Final Office Action dated May 22, 2015 in U.S. Appl. No. 14/040,400, filed Sep. 27, 2013.

* cited by examiner

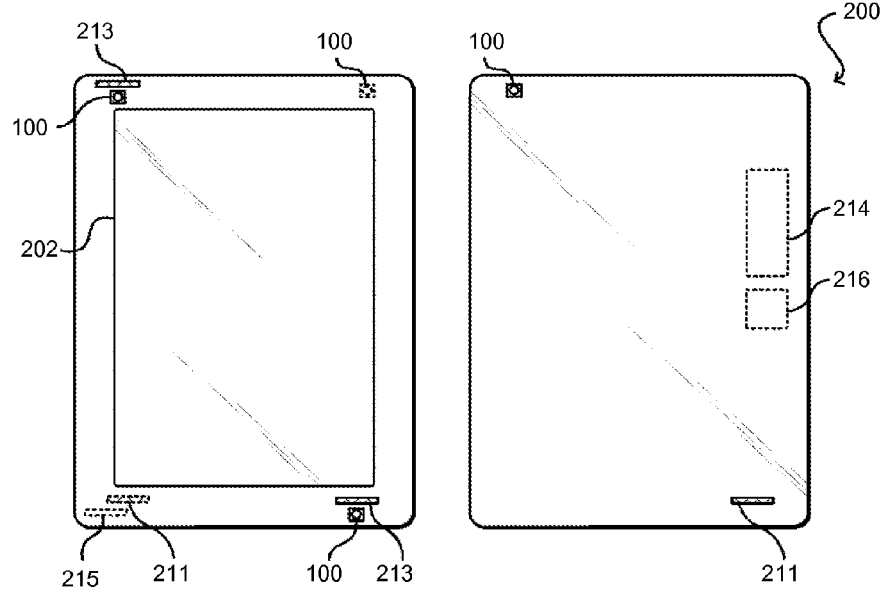
FIG. 2A  FIG. 2B
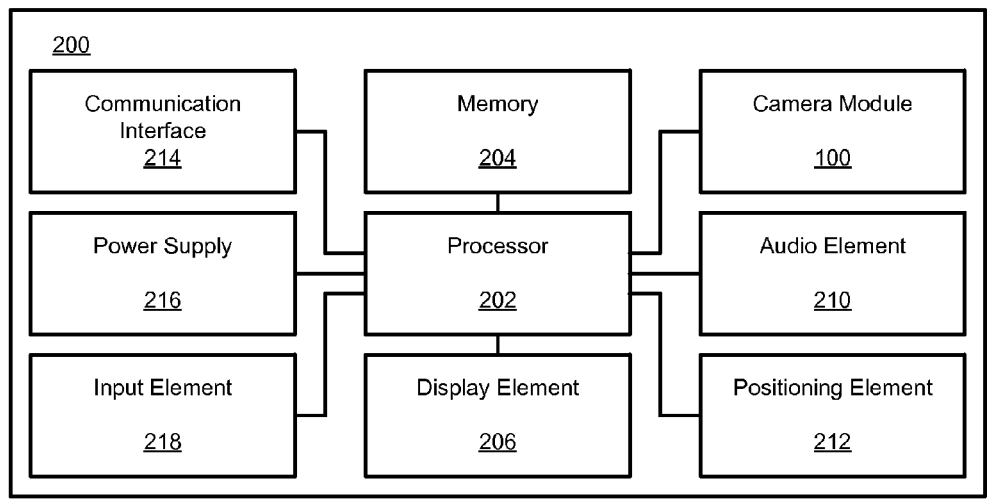
FIG. 3

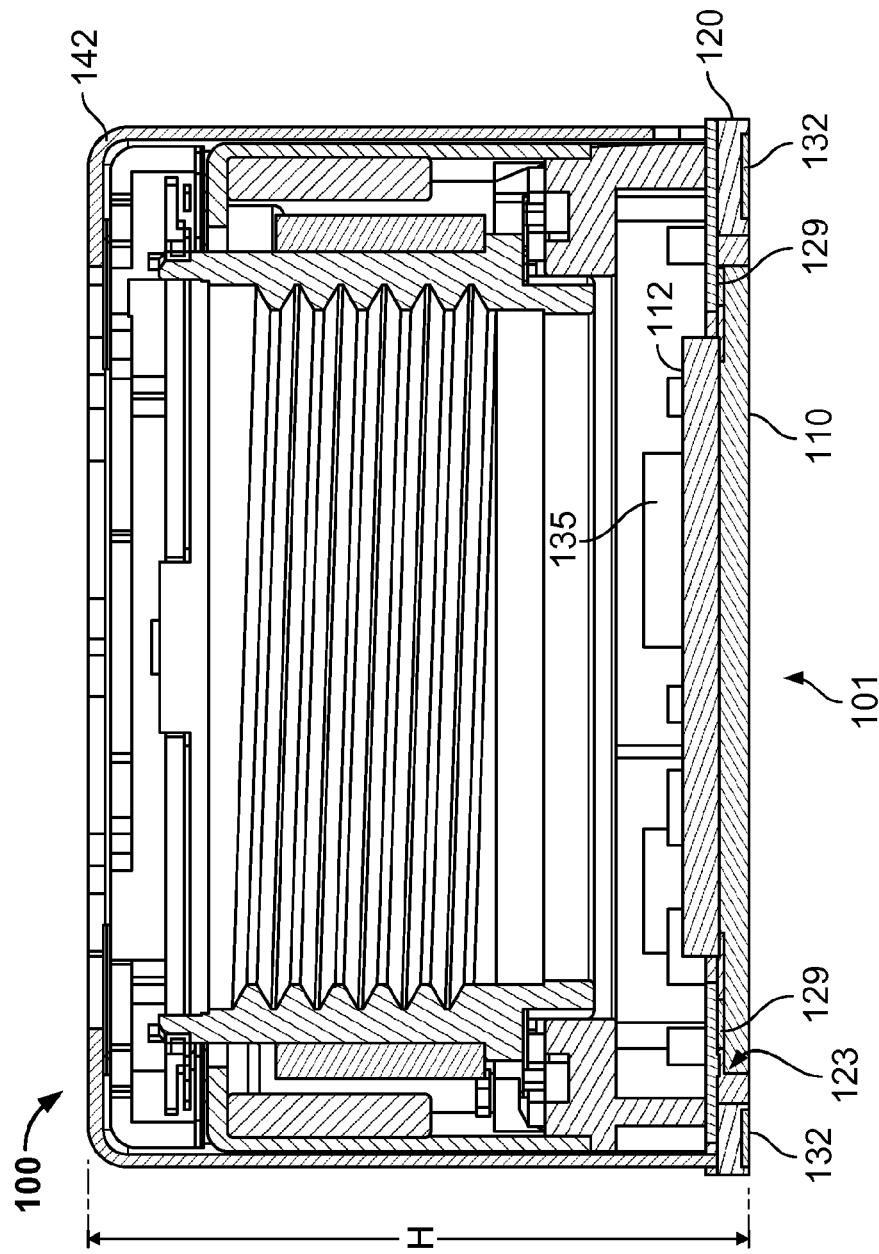

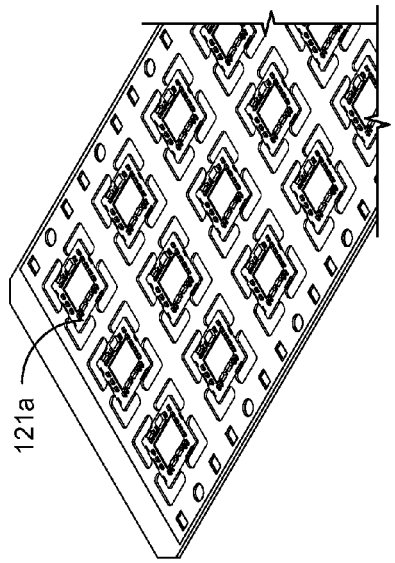
FIG. 6F
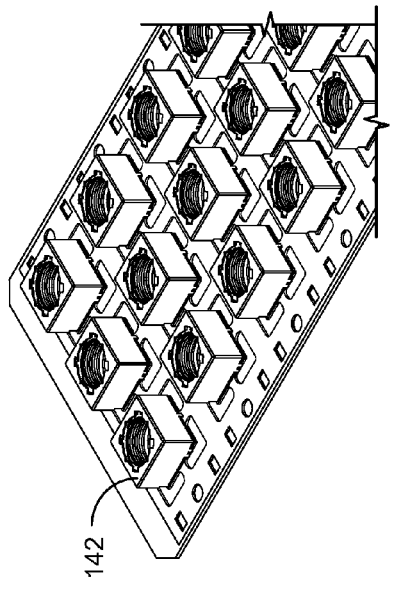
FIG. 6G
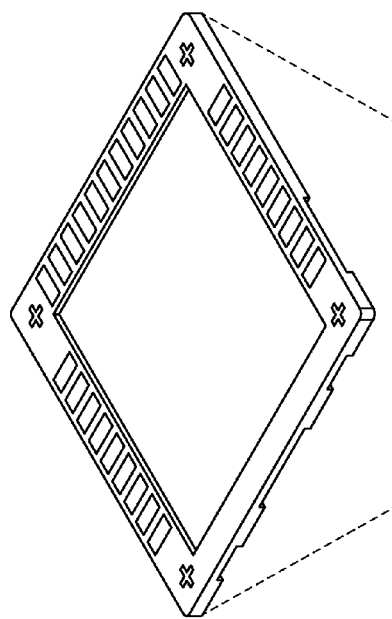
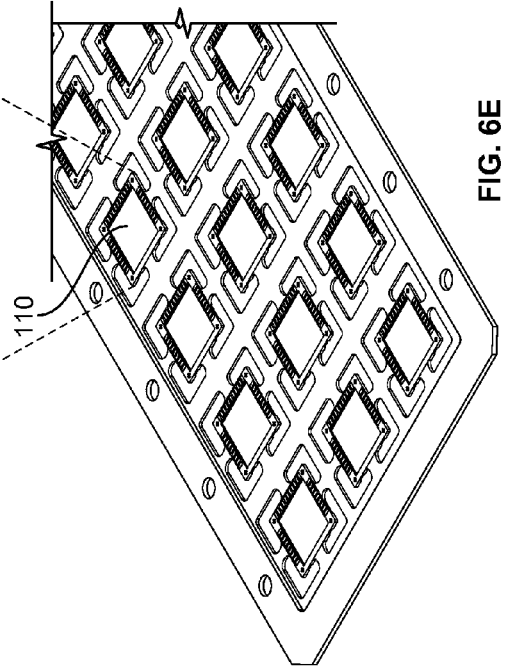
FIG. 6E

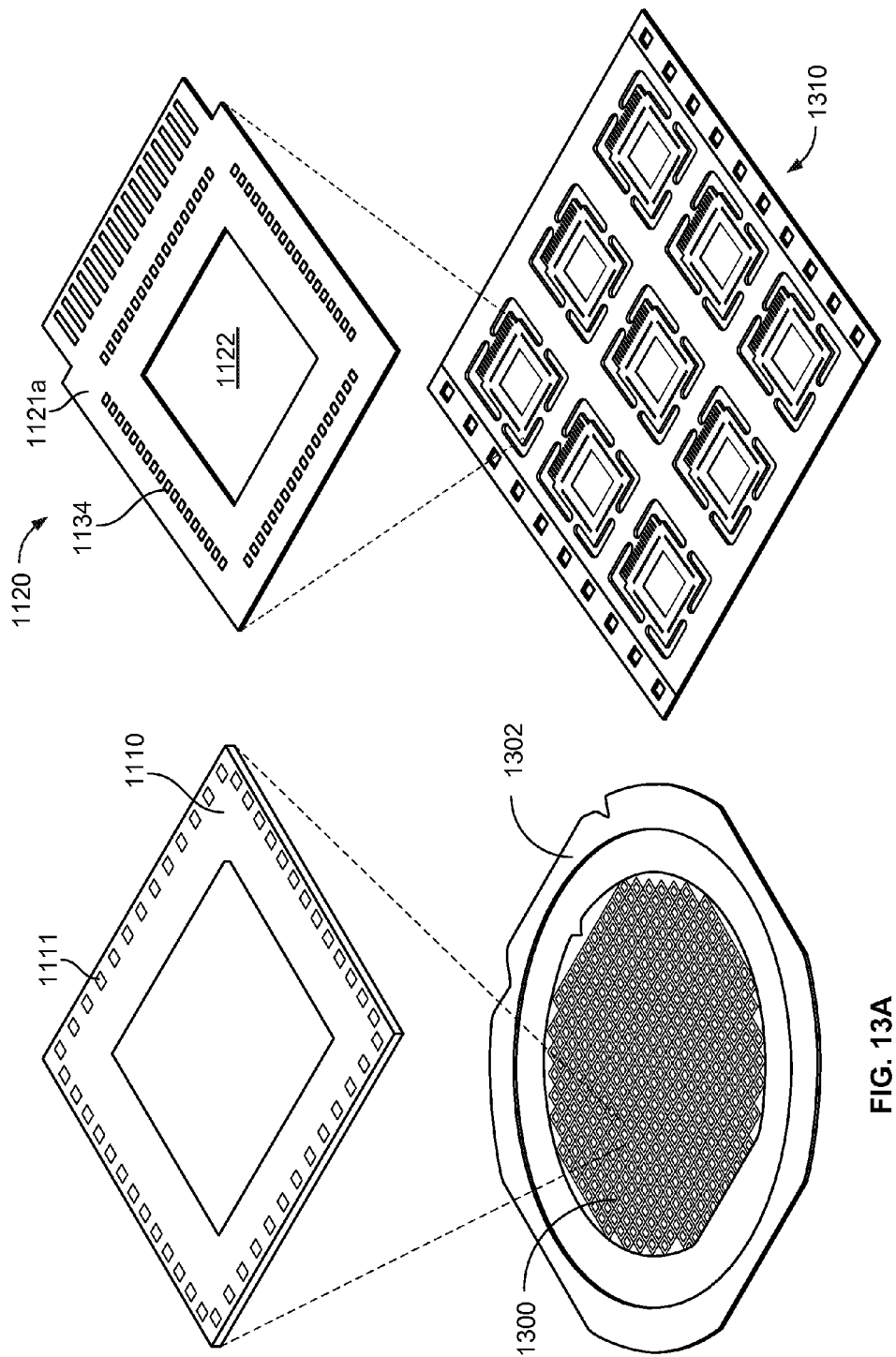

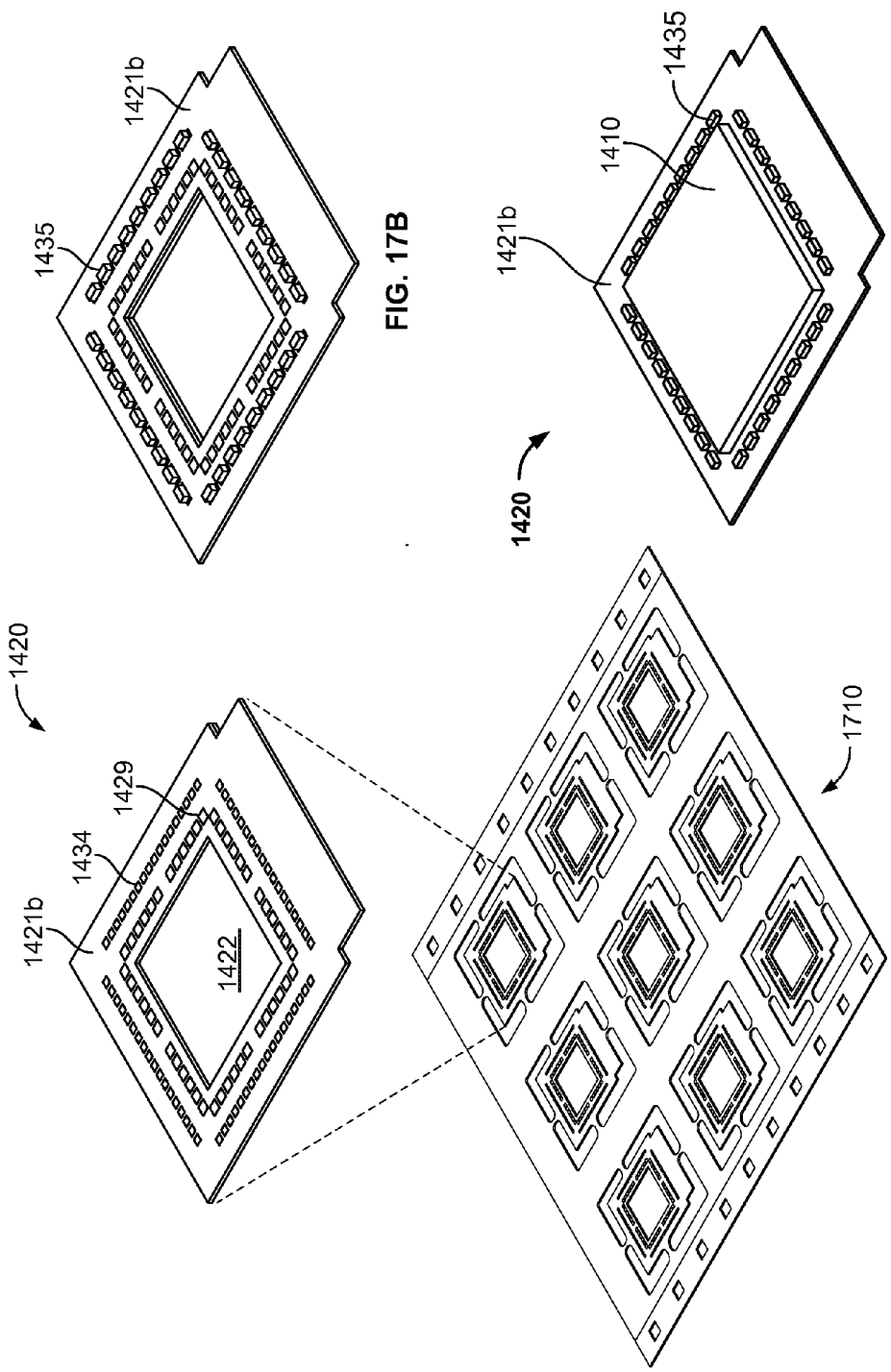

CAMERA MODULE INCLUDING IMAGE SENSOR DIE IN MOLDED CAVITY SUBSTRATE

BACKGROUND

Digital camera functionality is being incorporated into a wide variety of electronic devices. In particular, there is an increased demand by consumers for high quality photographic capability in consumer electronics and mobile computing devices, such as mobile phones, smartphones, and tablet computers. However, there is also high demand for mobile computing devices with increasingly small form factors, with extremely thin devices being particularly desirable for both aesthetics and portability. In addition, there is an ongoing desire to improve quality and functionality while decreasing the cost of components and manufacturing.

Accordingly, there is a need for improved camera module designs and manufacturing processes for incorporation into electronic devices.

BRIEF DESCRIPTION OF DRAWINGS

FIGS. 2A-2B illustrate front and back views, respectively, of an example portable computing device that may incorporate a camera module in accordance with embodiments of the present invention.

FIG. 3 is an example block diagram illustrating basic components of a computing device, in accordance with embodiments of the present invention.

FIGS. 4A-4B are cross-sectional and perspective cross-sectional views of a camera module, in accordance with embodiments of the present invention.

FIGS. 6A-6G illustrate various steps in the manufacturing process illustrated in FIG. 5.

FIGS. 13A-13L illustrate various steps in the manufacturing process illustrated in FIG. 12.

FIGS. 17A-17E illustrate various steps in the manufacturing process illustrated in FIG. 16.

DETAILED DESCRIPTION

In the following description, reference is made to the accompanying drawings which illustrate several embodiments of the present invention. It is understood that other embodiments may be utilized, and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Systems and methods in accordance with various embodiments of the present disclosure provide improved manufacturing methods and camera module designs that are compact, inexpensive to manufacture, and reliable in operation. These designs may provide small form factor autofocus (AF) camera modules for incorporation into thin mobile devices, such as tablets or smartphones.

Figure 1:
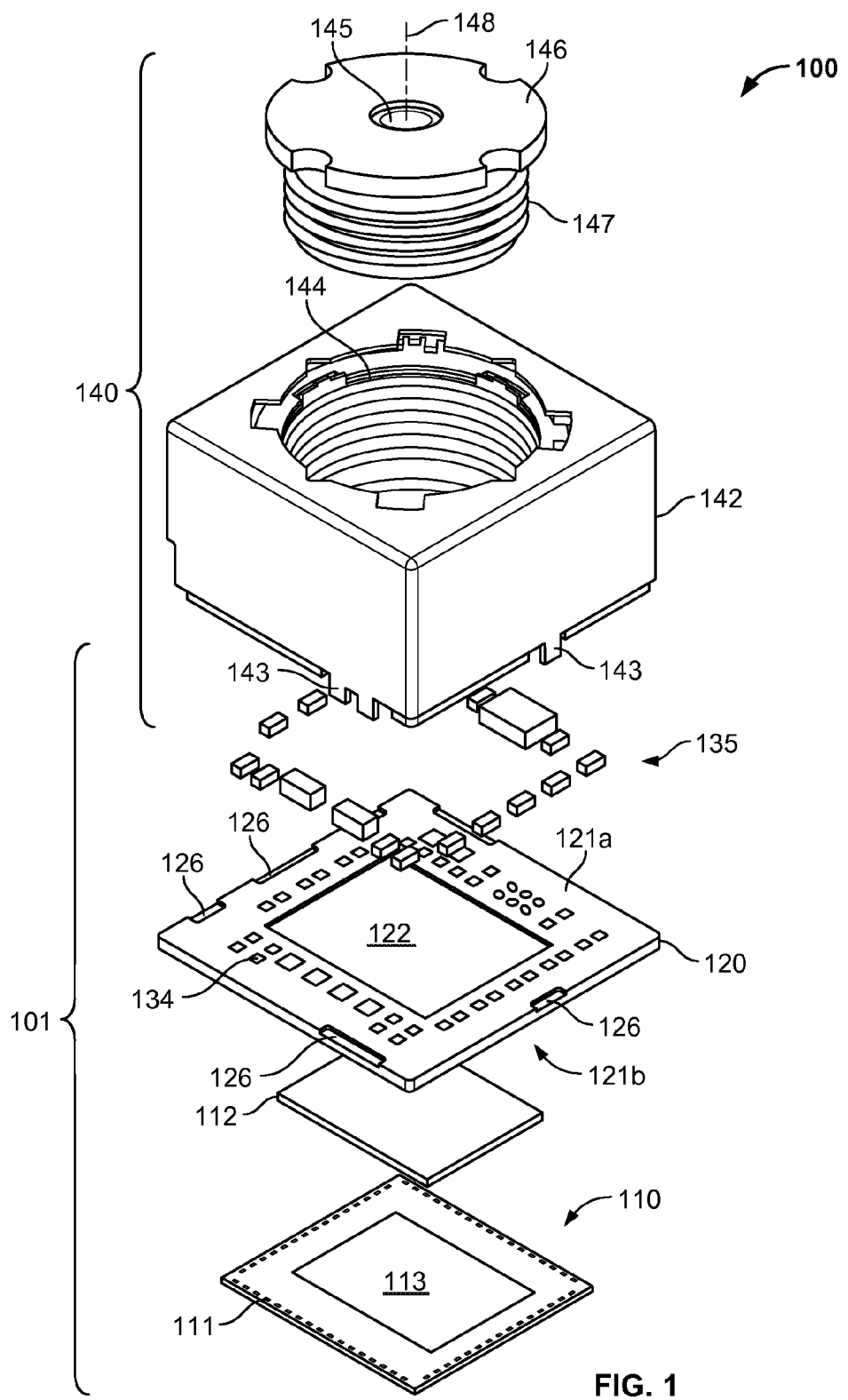
FIG. 1 is an exploded perspective view of a camera module with an image sensor die positioned in a substrate cavity, in accordance with embodiments of the present invention.
Figure 4B:
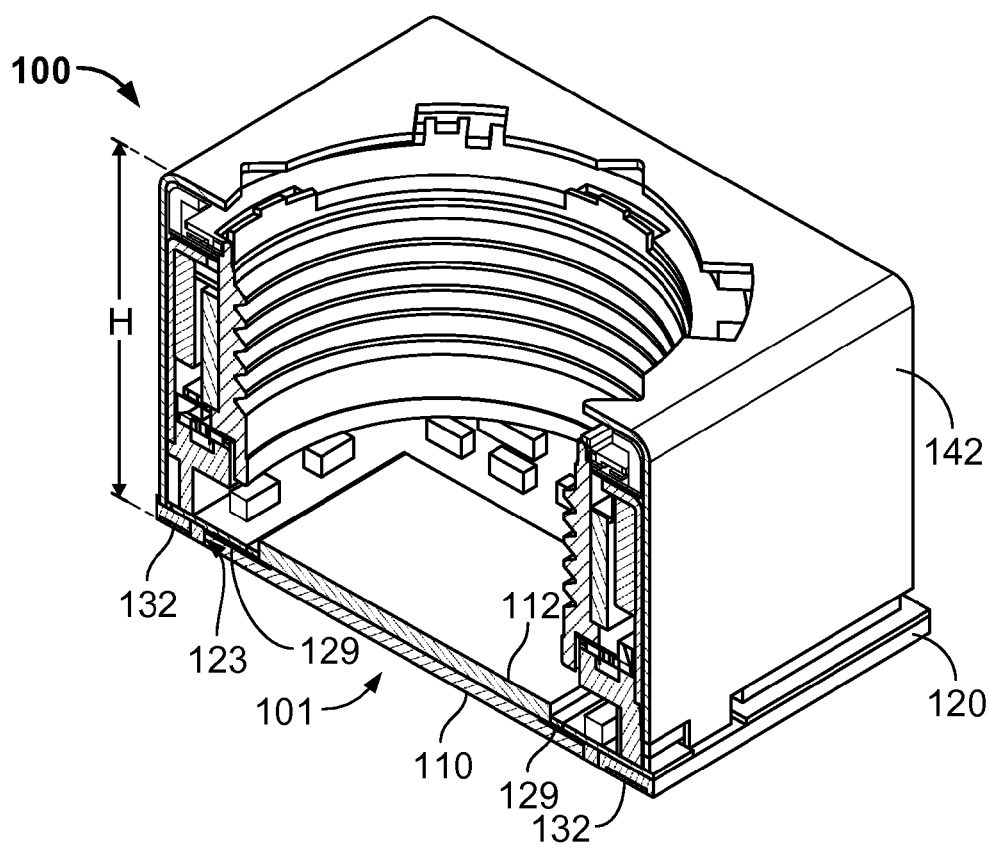

FIG. 1 is an exploded perspective view of a camera module 100 with an image sensor die positioned in a substrate cavity, in accordance with embodiments of the present invention. FIGS. 4A-4B are cross-sectional and perspective cross-sectional views of the camera module 100.

The camera module 100 comprises an image sensor module 101 and a lens module 140. The image sensor module 101 comprises an image sensor 110, an infrared (IR) filter 112, a substrate 120, and electronic components 135.

The lens module 140 comprises an autofocus lens housing 142 forming a cavity containing one or more lenses 145 which are supported by a lens barrel 146. The lens barrel 146 includes a threaded section 147 and is received in a corresponding lens barrel 144, which is driven by motors or actuators in the lens housing 120 to rotate, thereby translating the lens barrel 146 up and down along optical axis 148. The lens module 140 may utilize voice coil motors (VCM) to move the lens barrel 146. module along the optical axis of the camera. Alternatively, microelectromechanical systems (MEMS) actuators, may be used to translate the lenses 145. A variety of camera modules, including a variety of multi-lens autofocus camera modules, are commercially available and may be utilized in accordance with various embodiments of the present invention.

The substrate 120 may comprise any form of circuit substrate suitable to provide the necessary interconnection structure for operation of the camera module 100, as is well known in the art. The substrate 120 may comprise, for example, a rigid substrate such as a laminate (e.g., a glass-reinforced epoxy-based laminate comprising FR-4, FR-5, and/or Bismaleimide-Triazine (BT) resin), ceramic, or rigid flex substrate having one or more interconnect and dielectric layers. The substrate 120 includes an image sensor opening 122, which exposes the image sensor die 110 to the light received by the lenses 145.

In the illustrated embodiment, the lower side 121b of the substrate 120 includes a recessed portion 123 (shown in FIG. 4A), which receives the image sensor die 110, thereby reducing the overall height H of the camera module 100. In some embodiments, the image sensor die 110 is fully received within the recessed portion 123 so as to provide a substantially planar bottom surface 101 of the camera module 100.

The recessed portion 123 of the lower side 121b of the substrate 120 includes a plurality of substrate-sensor contacts 129. The image sensor die 110 includes a plurality of output die contacts 111 formed along a periphery of the image sensor die 110 which are coupled to the substrate-sensor contacts 129, as will be described in greater detail below.

In the illustrated embodiment, the upper side 121a of the substrate 120 includes a plurality of component contacts 134 for coupling with the electronic components 135. The electronic components 135 may include passive and/or active components for processing the output signals from the image sensor. The passive components may include inductors, capacitors, or resistors. The electronic components 135 are coupled to the component contacts 134 formed on the substrate, thereby electrically coupling the passive components 135 with the image sensor die 110 via the substrate-sensor contacts 129.

The image sensor die 110 includes a photosensor portion 113 comprising comprise any type of image capturing element that converts an optical image into an electronic signal, such as a charge-coupled device (CCD) or complementary metal-oxide-semiconductor (CMOS) active pixel sensor. The IR filter 112 may be used for filtering infrared light received by the lens module 140.

The camera module 100 may be incorporated into any of a variety of electronic devices. FIGS. 2A-2B illustrate front and back views, respectively, of an example portable computing device 200 that may incorporate a camera module in accordance with various embodiments described herein. Although one example of an electronic device is shown, it should be understood that various other types of electronic devices that are capable of incorporating digital camera functionality can be used in accordance with various embodiments discussed herein. The electronic devices can include, for example, smartphones, electronic book readers, tablet computers, notebook computers, personal data assistants, cellular phones, video gaming consoles or controllers, television set top boxes, and portable media players, among others.

In this example, the portable computing device 200 has a display 202 (e.g., a liquid crystal display (LCD) element) operable to display image content to one or more users or viewers of the device. In at least some embodiments, the display screen provides for touch or swipe-based input using, for example, capacitive or resistive touch technology.

FIG. 3 is an example block diagram illustrating basic components of a computing device, such as computing device 200. In this example, the device 200 includes at least one processor 202 for executing instructions that can be stored in at least one memory device 204. As would be apparent to one of ordinary skill in the art, the memory device 204 can include one or more different types of memory, data storage or computer-readable storage media, such as, for example, a first data storage for program instructions for execution by the processor 202, a second data storage for images or data and/or a removable storage for transferring data to other devices.

The computing device 200 includes one or more camera modules 100 configured to capture an image of people or objects in the vicinity of the device 200. The computing device 200 may include a main board, which may be the primary circuit board for the computing device 200 onto which one or more of the following components may be mounted. The camera module 100 includes a circuit substrate 120 which may be electrically coupled to the main board of the computing device 200 in a variety of ways, such as by direct mounting to the main board or with an interposer, which serves as an intermediate coupling device providing an electrical interface between the circuit substrate 120 and the main board. The interposer may comprise, for example, a cable or a rigid or flexible circuit board having interfaces coupled to the circuit substrate 120 and the main board, as will be described in greater detail below.

The computing device 200 includes a display element 206 for displaying images using technologies such as, for example, electronic ink (e-ink), organic light emitting diode (OLED) or liquid crystal display (LCD). The computing device 200 may also include an audio element 210, such as one or more audio speakers 211 and/or audio capture elements capable of capturing audio data, such as microphones 213. The computing device 100 may also include a positioning element 212, such as motion, position or orientation determining element 215, that provides information such as a position, direction, motion, or orientation of the device 200. The computing device 200 can include one or more input elements 218 operable to receive inputs from a user. The input elements 218 can include, for example, a push button, touch pad, touch screen, wheel, joystick, keyboard, mouse, trackball, keypad or any other such device or element whereby a user can provide inputs to the computing device 200. The computing device 200 may also include at least one communication interface 214, comprising one or more wireless components operable to communicate with one or more separate devices within a communication range of the particular wireless protocol. The wireless protocol can be any appropriate protocol used to enable devices to communicate wirelessly, such as Bluetooth, cellular, or IEEE 802.11. It should be understood that the computing device 200 may also include one or more wired communications interfaces for coupling and communicating with other devices. The computing device 200 may also include a power supply 216, such as, for example, a rechargeable battery operable to be recharged through conventional plug-in approaches, or through other approaches such as capacitive charging.

Figure 5:
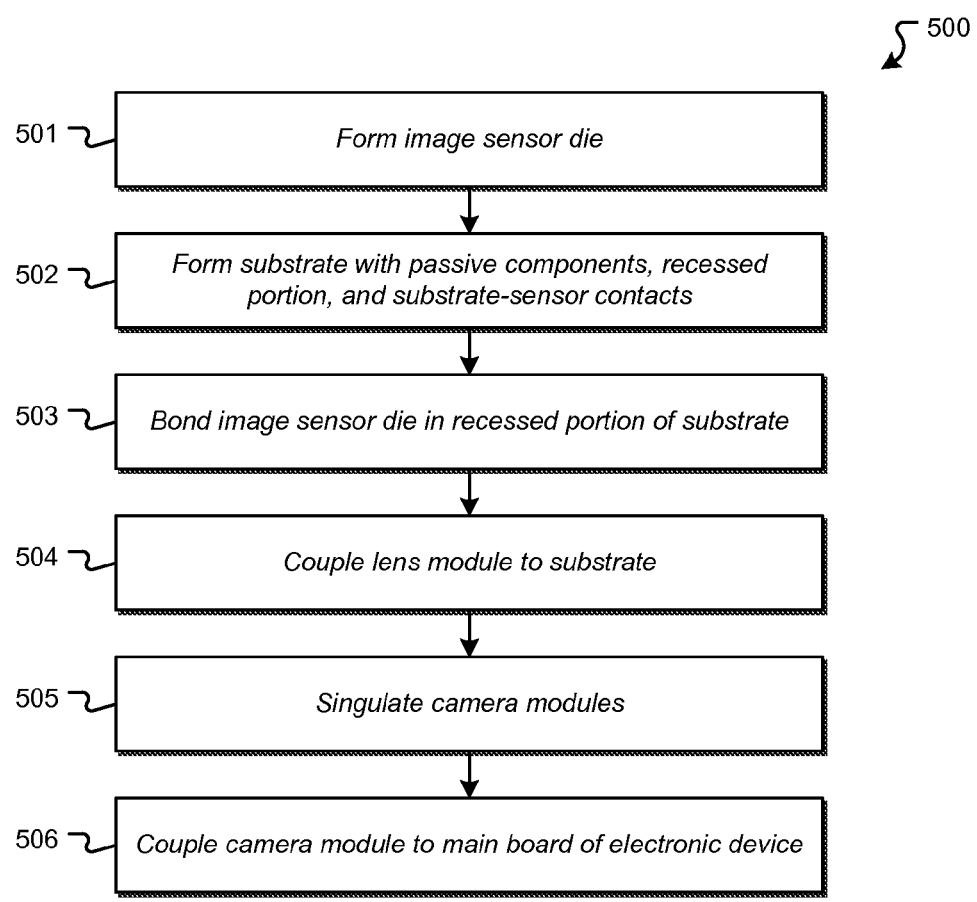
FIG. 5 is a flowchart illustrating a method of manufacturing a camera assembly using flip-chip bonding of an image sensor die in a recess of a substrate, in accordance with embodiments of the present invention.

FIG. 5 is a flowchart illustrating a method 500 of manufacturing a camera assembly 100 using flip-chip bonding of an image sensor die 110 in a recess 123 of a substrate 120, in accordance with embodiments of the present invention. FIGS. 6A-6G illustrate various steps in the manufacturing process 500.

Figure 6B:
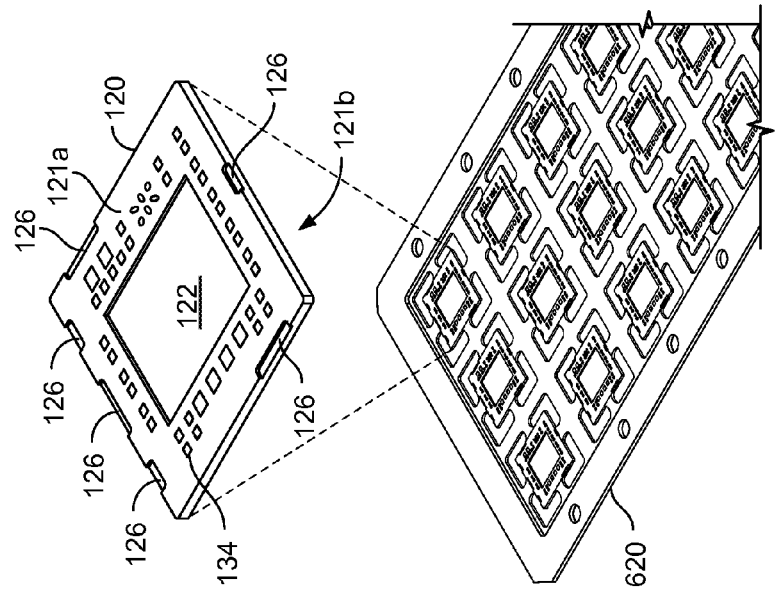
Figure 6A:
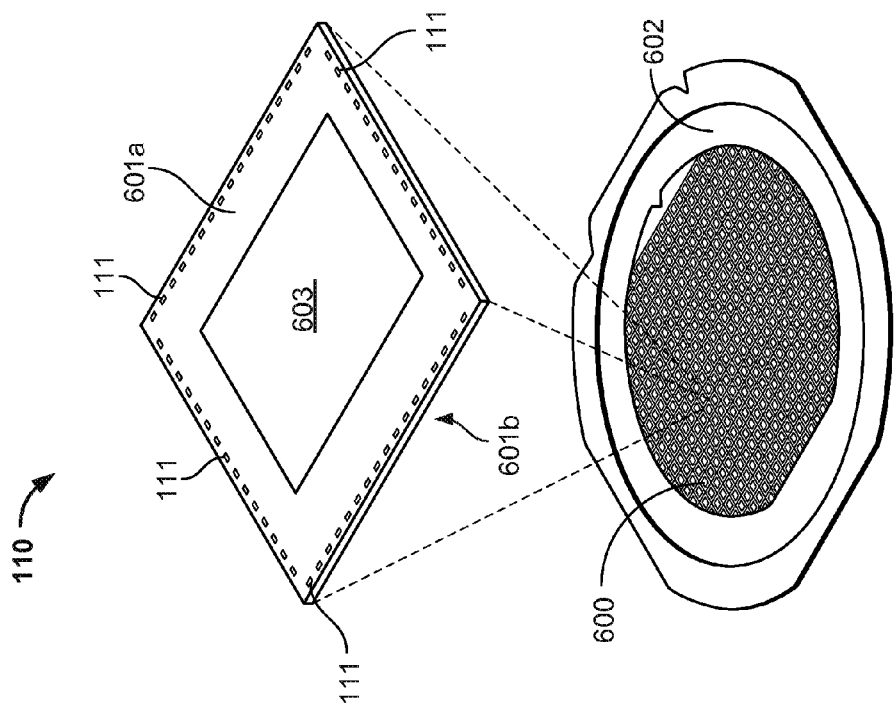

In step 501, shown in FIG. 6A, the image sensor die 110 is formed. Before each image sensor die 110 is singulated or diced from the wafer 600 held in the wafer carrier 602, a plurality of die contacts 111 are formed on the upper surface 601a of each image sensor die 110. The die contacts 111 can be formed in a variety of ways, depending on the desired method of coupling the image sensor die 110 to the substrate 120. In some embodiments, the die contacts 111 may comprise gold stud bumps. Alternatively, the die contacts 111 may comprise any other type of suitable material and form, such as, e.g., sputter plated bumps, gold plated bumps, or copper pillar bumps.

Figure 6D:
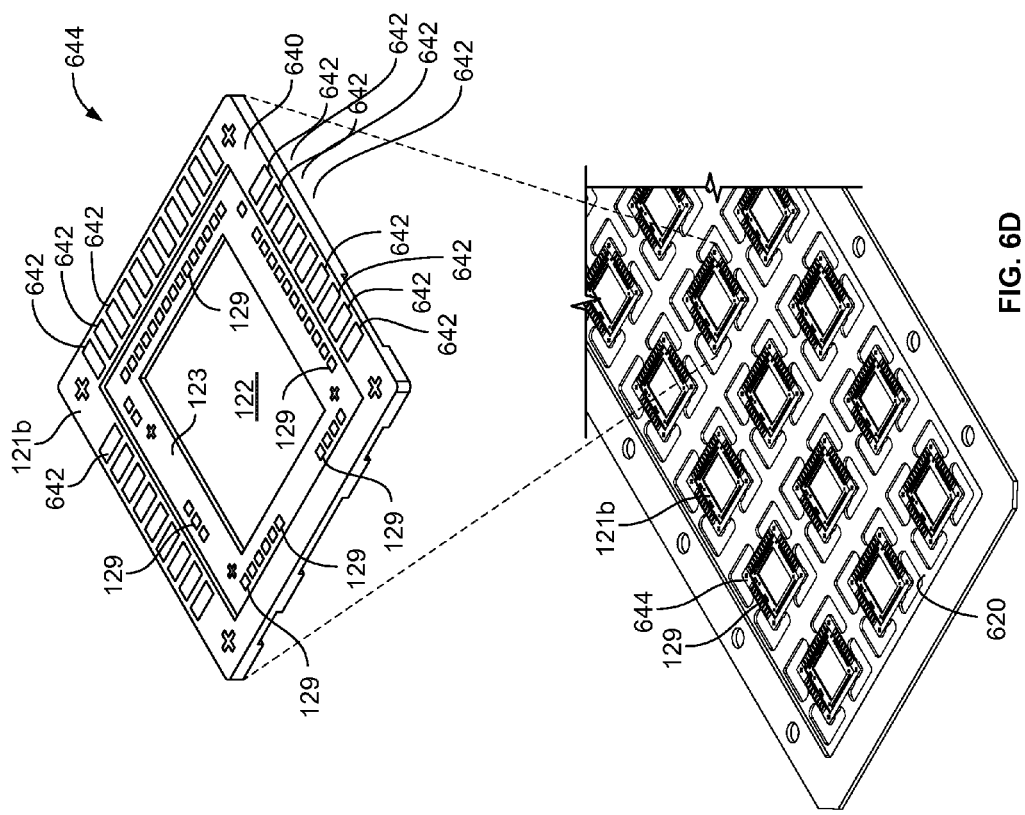
Figure 6C:
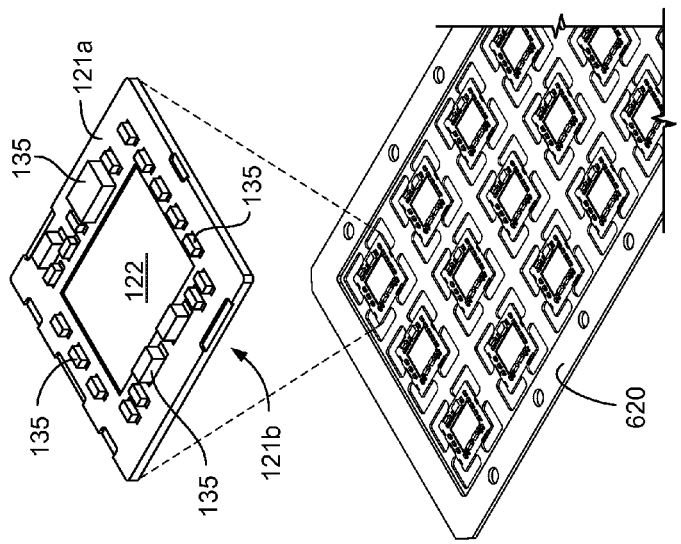

In step 502, shown in FIGS. 6B-6D, a plurality of substrates 120 are provided in a substrate strip array 620. The upper side 121a of each substrate 120 includes a plurality of component contacts 134 around the periphery of the image sensor opening 122. Electronic components 135 may be coupled to each of these contacts 134 using surface mount technology (SMT). A plurality of lens module connections 126 are provided along the outer edges of the substrate 120 for coupling with corresponding contacts 143 (shown in FIG. 1) in the lens housing 142. These lens module connections 126 may be used to provide power, ground, and control signals to the lens module 126. The various contacts provided on the substrate 120 may be formed, e.g., using electroless nickel immersion gold (ENIG) plating techniques. ENIG is an electroless nickel layer capped with a thin layer of immersion gold, which provides a multifunctional surface finish. The immersion gold protects the underlying nickel from oxidation/passivation.

FIG. 6D shows the lower side 121b of each substrate 120. The lower side 121b includes a recessed portion 123 along a periphery surrounding the image sensor opening 122 and a non-recessed portion 640 surrounding the recessed portion 123. A plurality of substrate-sensor contacts 129 is formed on the recessed portion 123 for bonding with the die contacts 111 on the image die sensor 110. The non-recessed portion 640 of the lower side 121b of the substrate 120 includes a main board contact region comprising a land grid array (LGA) 644 of a plurality of main board contacts 642.

In step 503, shown in FIG. 6E, an image sensor die 110 positioned in the recessed portion 123 of each substrate 120, and the die contacts 111 are bonded with the substrate-sensor contacts 129. The bonding of the image sensor die 110 to the substrate 120 may be performed in a variety of ways. For example, flip-chip bonding may be used to bond the gold stud bump die contacts 111 with substrate-sensor land pad contacts 129. In one embodiment, flip chip bonding using a conductive epoxy process followed by a jetting unfill process may be used. In another embodiment, flip chip bonding using a thermal ultrasonic (T/S) bonding process to form an intermetallic coverage (IMC) between the die contacts 111 and substrate-sensor contacts 129 followed by a jetting unfill process may be used. In another embodiment, flip chip bonding using a thermal-compression (T/C) bonding process with a non-conductive paste (NCP) dispensed on the substrate-sensor contacts 129 may be used. In another embodiment, flip chip bonding of plated bump die contacts 111 using a T/C bonding process with an anisotropic conductive paste (ACP) dispensed on the substrate-sensor contacts 129 may be used.

In step 504, shown in FIGS. 6F-6G, the lens housing 142 is coupled to the upper side 121a of the substrate 120. The lens housing 142 may be attached to the substrate 120 by depositing an adhesive, such as an epoxy adhesive, onto a portion of the substrate 120 not otherwise used for electrical connections. The lens module connections 126 may then be coupled to the corresponding contacts 143 in the lens housing 142 using, for example, conventional soldering methods. In FIG. 6G, the lens barrel 146 is omitted for clarity. In practice, the lens housing 142 with lens barrel 146 may or may not be attached to the substrate 120 prior to the singulation described below.

In step 505, each camera module 100 may then be singulated from the strip array 620 for integration with an electronic device, such as computing device 200.

In step 506, the camera module 100 is coupled to the main board of the electronic device to form a completed camera assembly. This may be accomplished using any of a variety of known methods. In the embodiment illustrated in FIGS. 6D-6E, the bottom side 121b of the substrate includes an LGA 644 with main board contacts 642 which can be bonded (e.g., soldered) directly to corresponding contacts on the main board or to an intermediate interposer structure, such as a cable or circuit board, which is in turn coupled to the main board.

It will be understood that in other embodiments, the type, arrangement, and manufacturing steps for the various components of the camera assembly may vary. For example, as illustrated in FIG. 6C, the electronic components 135 are mounted on the substrate 120 along all four edges of the image sensor opening 122. In other embodiments, the electronic components 135 may be mounted on fewer than four edges or may be positioned elsewhere in the camera module 100. In addition, the electronic components 135 need not be positioned within the cavity of the lens housing 142.

The above-described embodiments may achieve a number of advantages over conventional camera module designs. The overall size of the camera module may be reduced. The recessed portion of the substrate enables reduces the overall height of the camera module by eliminating any extra height that may result from attaching the image sensor die directly to the bottom of the substrate, and the non-recessed portion provides sufficient thickness to enable the necessary interconnect structure to be formed within the substrate and sufficient rigidity to maintain structural support for the camera module. The footprint of the camera module (i.e., the width and length) may be minimized as a result of placing the passive components on the upper side of the substrate around the periphery of the image sensor opening directly opposite from the flip-chip-bonded substrate-sensor contacts on the bottom side of the substrate and within the cavity of the lens housing.

In addition, the use of SMT and flip-chip bonding of components and elimination of wire bonding in various embodiments can enable the use of ENIG plating for the substrate contacts and the elimination of traditional gold plating used with wire bonding. Finally, the ability to perform numerous steps in the manufacturing process while the substrates remain in strip array format can enable more efficient batch processing, thereby reducing the cost per unit.

Figure 7:
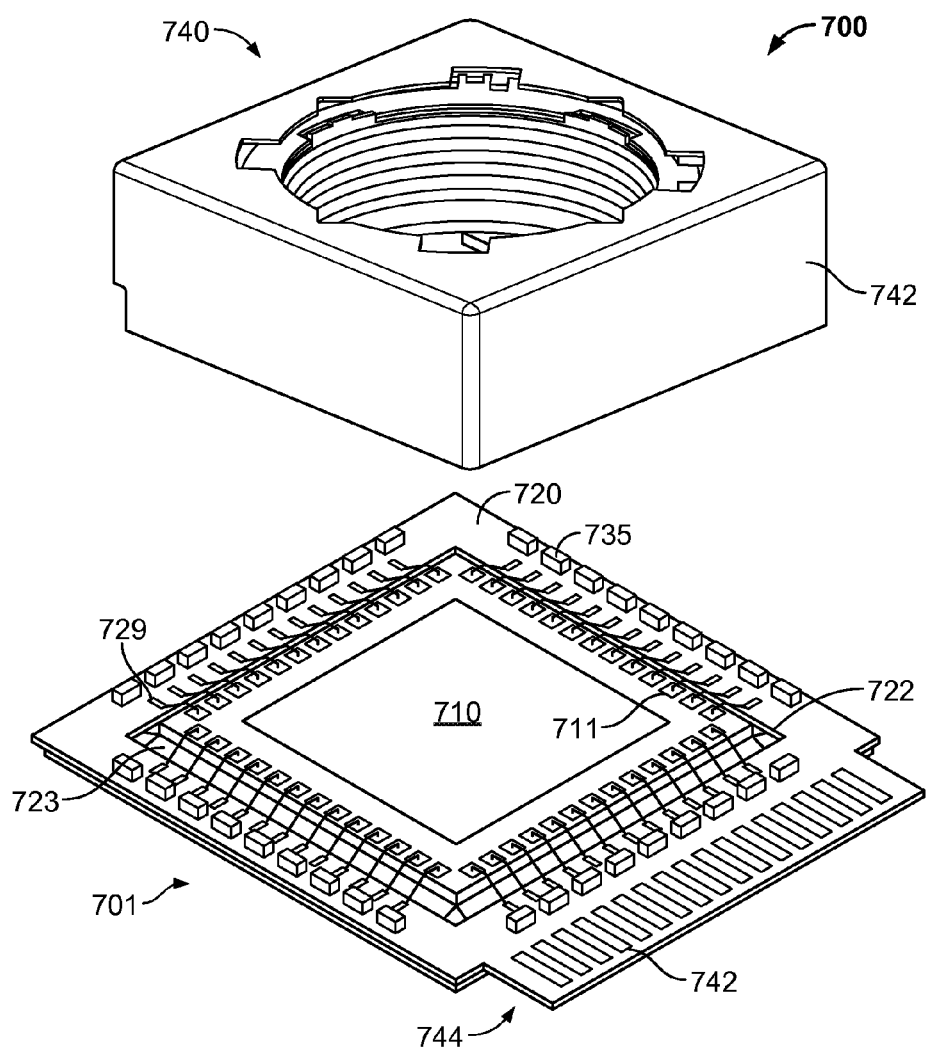
FIG. 7 is an exploded perspective view of a camera module with an image sensor die positioned in a molded cavity substrate, in accordance with other embodiments of the present invention.

FIG. 7 is an exploded perspective view of a camera module 700 with an image sensor die positioned in a molded cavity substrate, in accordance with other embodiments of the present invention. The camera module 700 comprises an image sensor module 701 and a lens module 740.

Figure 8:
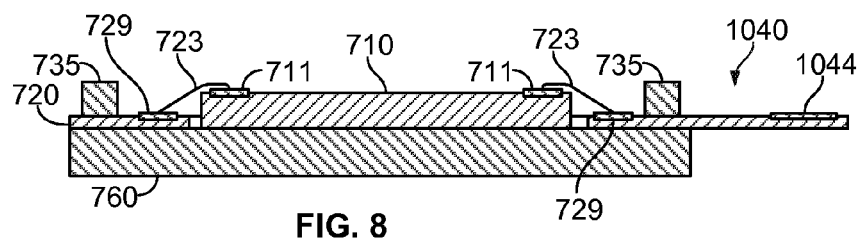
FIG. 8 is a cross-sectional view of an image sensor module, in accordance with other embodiments of the present invention.

FIG. 8 is a cross-sectional view of the image sensor module 701. The image sensor module 701 comprises an image sensor die 710, a substrate 720, and electronic components 735. The lens module 740 is similar to the lens module 140 described above and comprises an autofocus lens housing 742 forming a cavity containing one or more lenses.

The substrate 720 may comprise any form of circuit substrate suitable to provide the necessary interconnection structure for operation of the camera module 700, as is well known in the art. The substrate 720 may comprise, for example, a flexible substrate, such as a flexible high density interconnect (HDI) tape substrate, which is available in very thin configurations. The HDI tape substrate may comprise a multilayer interconnect structure using polyimide as a dielectric and electroplated copper conductor lines, The flexible substrate 720 may comprise a flexible base material comprising, e.g., polyester, polyimide, polyethylene napthalate, or polyetherimide, and conductive layers comprising, e.g., conductive metal foil, electroplated copper, screen printing metal circuits, or other conductive materials. As shown in FIG. 8, the thickness, t-s, of a substrate 720 having a suitable interconnect structure may be, for example, approximately 0.10 mm to 0.15 mm. Alternatively, substrate 720 may comprise a BT/FR4 laminate substrate, which may have a thickness, t-s, of approximately 0.3 mm-0.4 mm. The substrate 720 includes an image sensor opening 722, which exposes the image sensor die 710 to the light received by the lens module 740.

Figure 9:
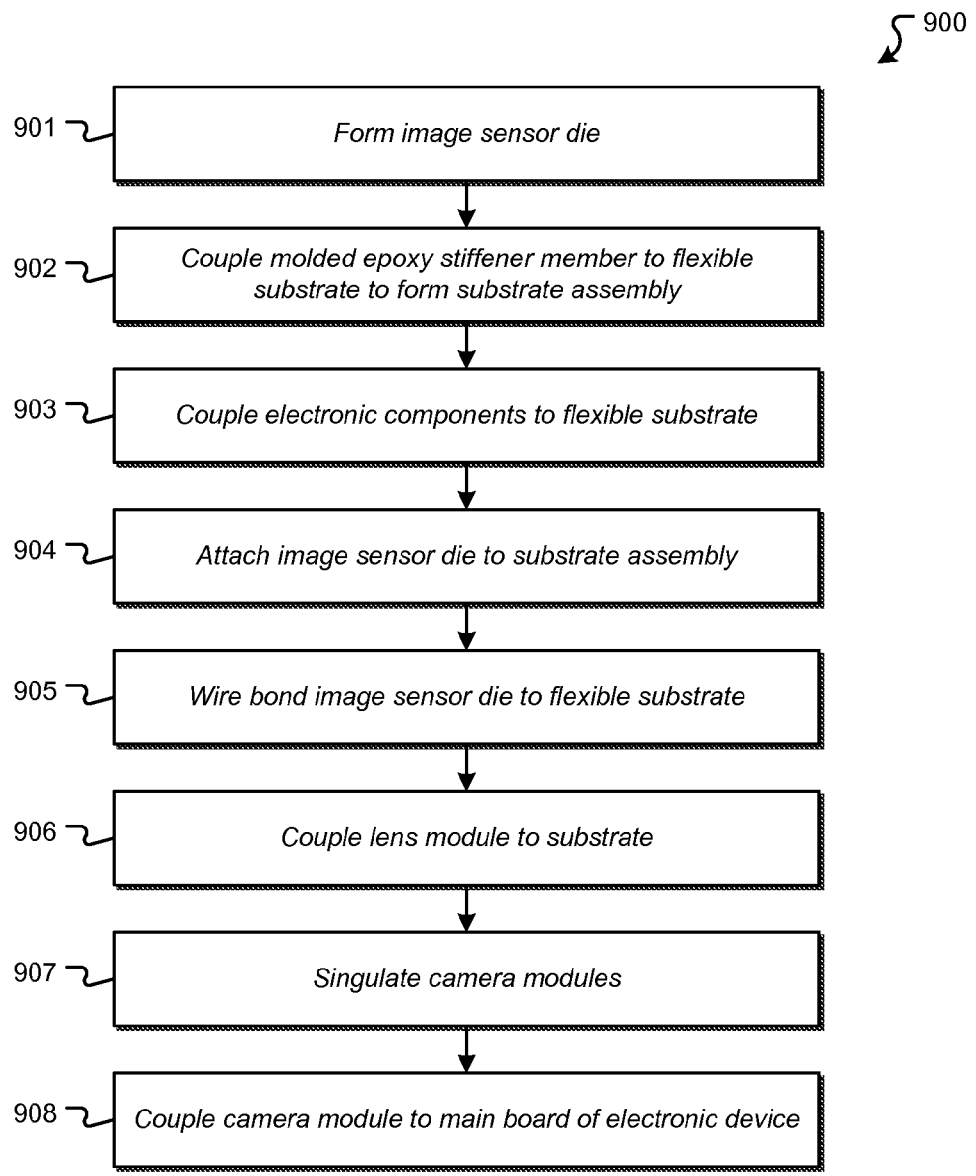
FIG. 9 is a flowchart illustrating a method of manufacturing a camera assembly with an image sensor die positioned in a molded cavity substrate, in accordance with embodiments of the present invention.

FIG. 9 is a flowchart illustrating a method 900 of manufacturing a camera assembly 700 with an image sensor die 710 positioned in a molded cavity substrate, in accordance with embodiments of the present invention. FIGS. 10A-10J illustrate various steps in the manufacturing method 900.

In step 901, the image sensor die 710 is formed. Before each image sensor die 710 is singulated from the wafer, a plurality of die contacts 711 are formed on the upper surface of each image sensor die 710. In contrast with the flip-chip embodiment shown in FIG. 6A, the die contacts 711 on the image sensor die 710 will be used for wire bonding with the substrate 720. The die contacts 711 may be formed using any of a variety of well-known techniques, such as, for example, using ball bonds.

Figure 10B:
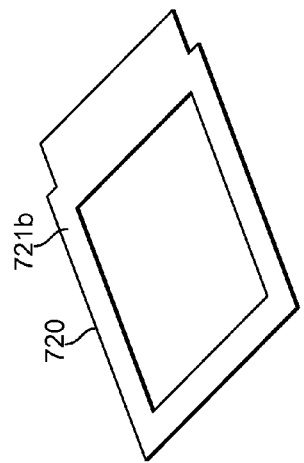
FIGS. 10A-10J illustrate various steps in the manufacturing process illustrated in FIG. 9.
Figure 10C:
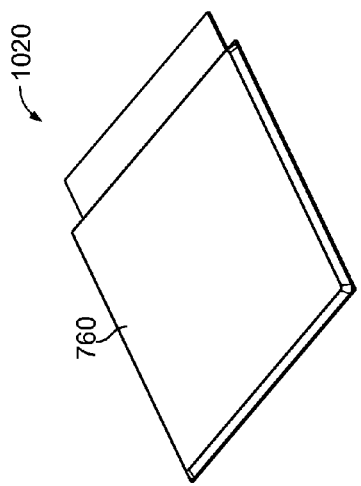
Figure 10A:
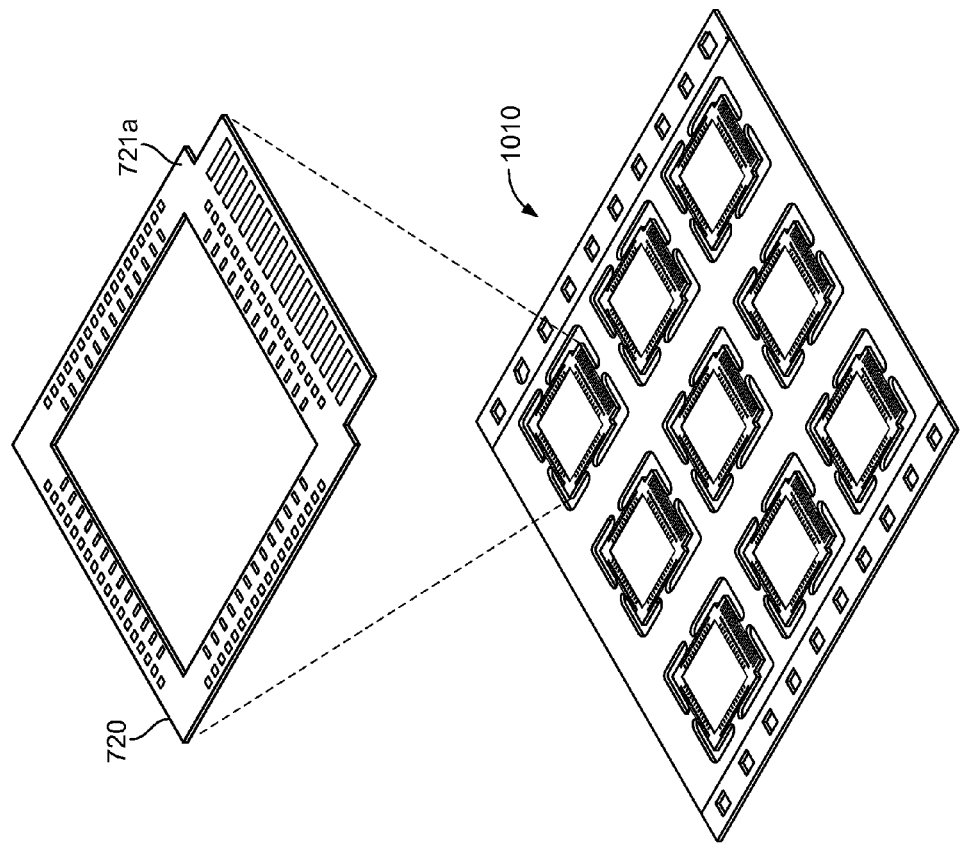

In step 902, shown in FIGS. 10A-10C, a molded stiffener member 760 is coupled to the flexible substrate 720 to form a substrate assembly 1020. The molded stiffener member 760 may comprise any of a variety of transfer molding materials well-known in the semiconductor packaging industry. The transfer molding material may comprise a resin with a hardener, accelerator, fillers, flame retardants, and other modifiers, such as an epoxy resin with a silica filler. However, unlike semiconductor packaging applications, the molded stiffener member 760 is not used in the camera module 700 to encapsulate and protect electronic devices. Instead, the molded stiffener member 760 is used to provide a rigid, planar support to the flexible tape substrate 720. The transfer molding material can be advantageous in this application because its manufacturing processes are well known and relatively inexpensive, and its physical characteristics are well documented.

FIG. 10A shows a plurality of flexible substrates 720 provided in a panel format strip array 1010. FIG. 10A shows the upper side 721a of the flexible substrates 720 and FIG. 10B shows the lower side 721b of one of the flexible substrates 720. FIG. 10C shows the lower side 721b of the flexible substrate 720 after the transfer molded stiffener member 760 is applied and a post mold curing step is completed.

Figures 10D, 10E:
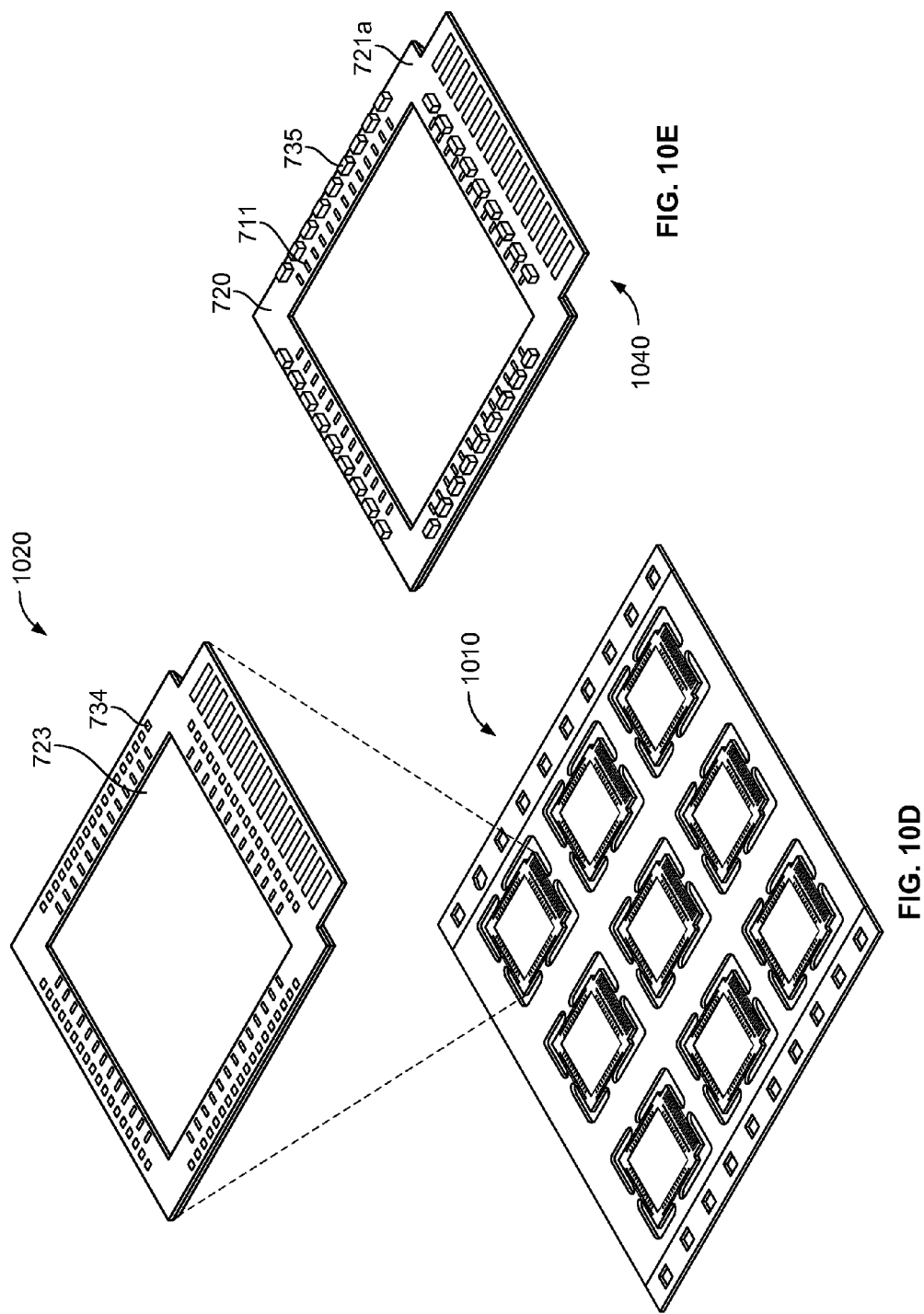

In step 903, shown in FIGS. 10D-10E, the electronic components 735 are coupled to the substrate 720. The upper side 721a of each substrate 720 includes a plurality of component contacts 734 around the periphery of the image sensor opening 722. After the molded stiffener member 760 is applied, a portion of the upper side of the molded stiffener member 760 is exposed by the image sensor opening 722 and forms a die attach region 723. The electronic components 735 may be coupled to each of these contacts 734 using SMT processes, similar to those described above with respect to FIGS. 6B-6D.

Figure 10F:
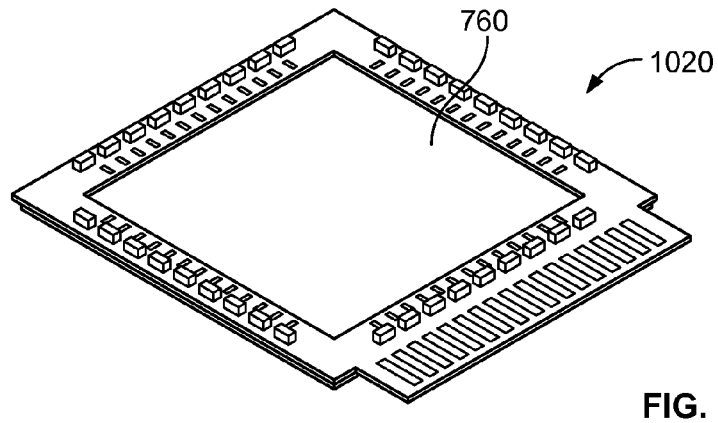
Figure 10G:
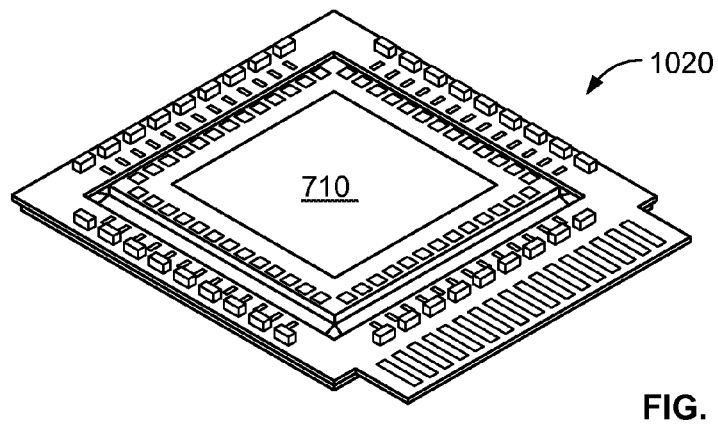

In step 904, shown in FIGS. 10E-10G, the image sensor die 710 is attached to the substrate assembly 1020, using, for example, an epoxy adhesive. In the illustrated embodiment, the image sensor opening 722 is larger than the image sensor die 710, so the image sensor die 710 is positioned entirely within the image sensor opening 722 and is bonded entirely to the molded stiffener member 760 without the flexible substrate 720 interposed between the die 710 and the stiffener member 760, thereby slightly reducing the overall height of the camera module 700.

Figure 10H:
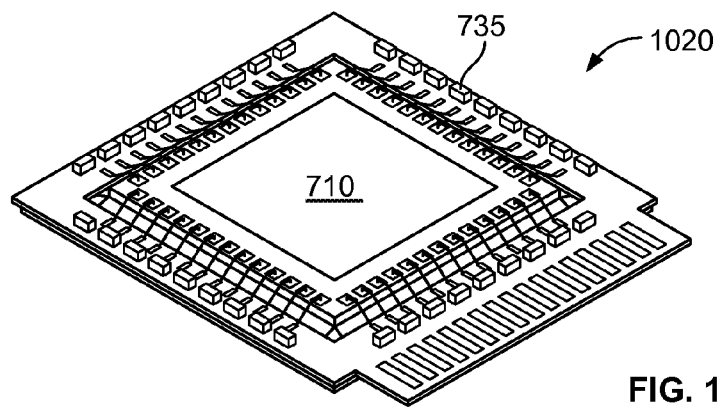

In step 905, shown in FIG. 10H, the die contacts 711 on the upper surface of each image sensor die 710 are wire bonded to substrate-sensor contacts 729 on the upper surface of the flexible substrate 720.

Figure 10I:
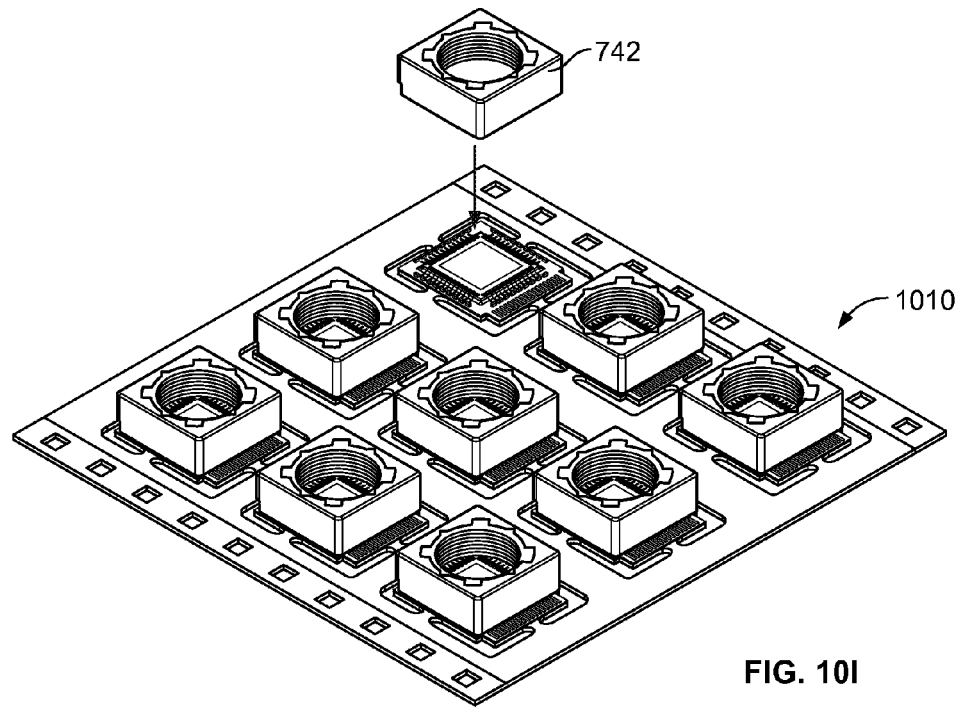

In step 906, shown in FIG. 10I, the lens housing 742 is coupled to each of the substrate assemblies 1020 in the panel format strip array 1010. The lens housing 742 may be attached to the substrate assemblies 1020 by depositing an adhesive, such as an epoxy adhesive, onto a portion of the substrate assembly 1020 not otherwise used for electrical connections. The lens module connections (not shown) on the substrate assembly 1020 may then be coupled to the corresponding contacts (not shown) in the lens housing 742 using, for example, conventional soldering methods.

Figure 10J:
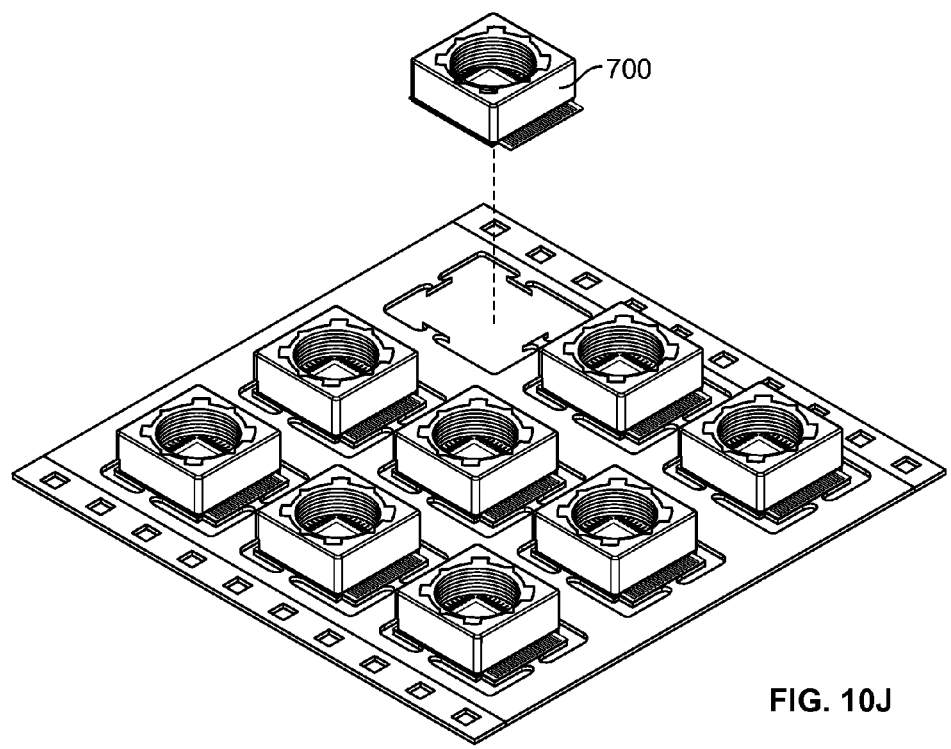

In step 907, shown in FIG. 10J, each camera module 700 may then be singulated from the strip array 1010 for integration with an electronic device, such as computing device 200.

In step 908, the camera module 700 is coupled to the main board of the electronic device to form a completed camera assembly. This may be accomplished using any of a variety of known methods. The upper side 721a of the substrate assembly 1020 includes a main board contact region 1040, which may extend beyond the stiffener member 760, as shown in FIG. 8. The region directly underneath the extending main board contact region 1040 may provide clearance for other components in the device. The main board contact region 1040 includes a plurality of LGA pads 1044 which may be coupled to main board contacts on the main board of the electronic device. The LGA pads 1044 receive all of the power and I/O signals required for operation of the camera module 700. The LGA pads 1044 can be bonded (e.g., soldered) directly to corresponding contacts on the main board or to an intermediate interposer structure, such as a cable or circuit board, which is coupled to the main board.

It will be understood that in other embodiments, the type, arrangement, and manufacturing steps for the various components of the camera assembly may vary. For example, as illustrated in FIG. 7, the electronic components 735 are mounted on the substrate assembly 1020 along all four edges of the image sensor opening 722. In other embodiments, the electronic components 135 may be mounted on fewer than four edges or may be positioned elsewhere in the camera module 100. In addition, the contacts for power and I/O with the main board need not be provided in an LGA fan-out main board contact region 1040. These contacts may be formed using any of the contact techniques described herein or known by one of ordinary skill in the art.

The above-described embodiments may achieve a number of advantages over conventional camera module designs. The overall size of the camera module may be reduced. Positioning the image sensor die in the image sensor opening can enable reduction of the overall height of the camera module by eliminating any extra height that may result from attaching the image sensor die directly to the top of the tape substrate. The molded stiffener member provides sufficient rigidity to maintain structural support for the camera module.

Because HDI tape substrates provide much higher line pitch than conventional laminate substrates, the use of HDI tape substrates can enable a reduction in the number of layers necessary for the interconnect structure of the substrate. Exemplary HDI tape substrates may have, for example, a line pitch of between 16 μm-50 μm.

Flip-chip bonding of the image sensor die utilizes the application of pressure and heat to the back side of the die, which requires that the die be thick enough to withstand the pressure without damage. However, when the image sensor die is wire bonded to the substrate assembly, pressure and heat need not be applied to the die, thereby enabling a reduction in die thickness.

In addition, the ability to perform numerous steps in the manufacturing process while the substrate assemblies remain in strip array format can enable more efficient batch processing, thereby reducing the cost per unit. Flexible tape substrates may be provided in even larger strips than conventional ceramic and laminate strip arrays, thereby increasing the number of camera modules that may be manufactured in each batch, resulting in an improvement in the manufacturing units per hour (UPH).

Figure 11:
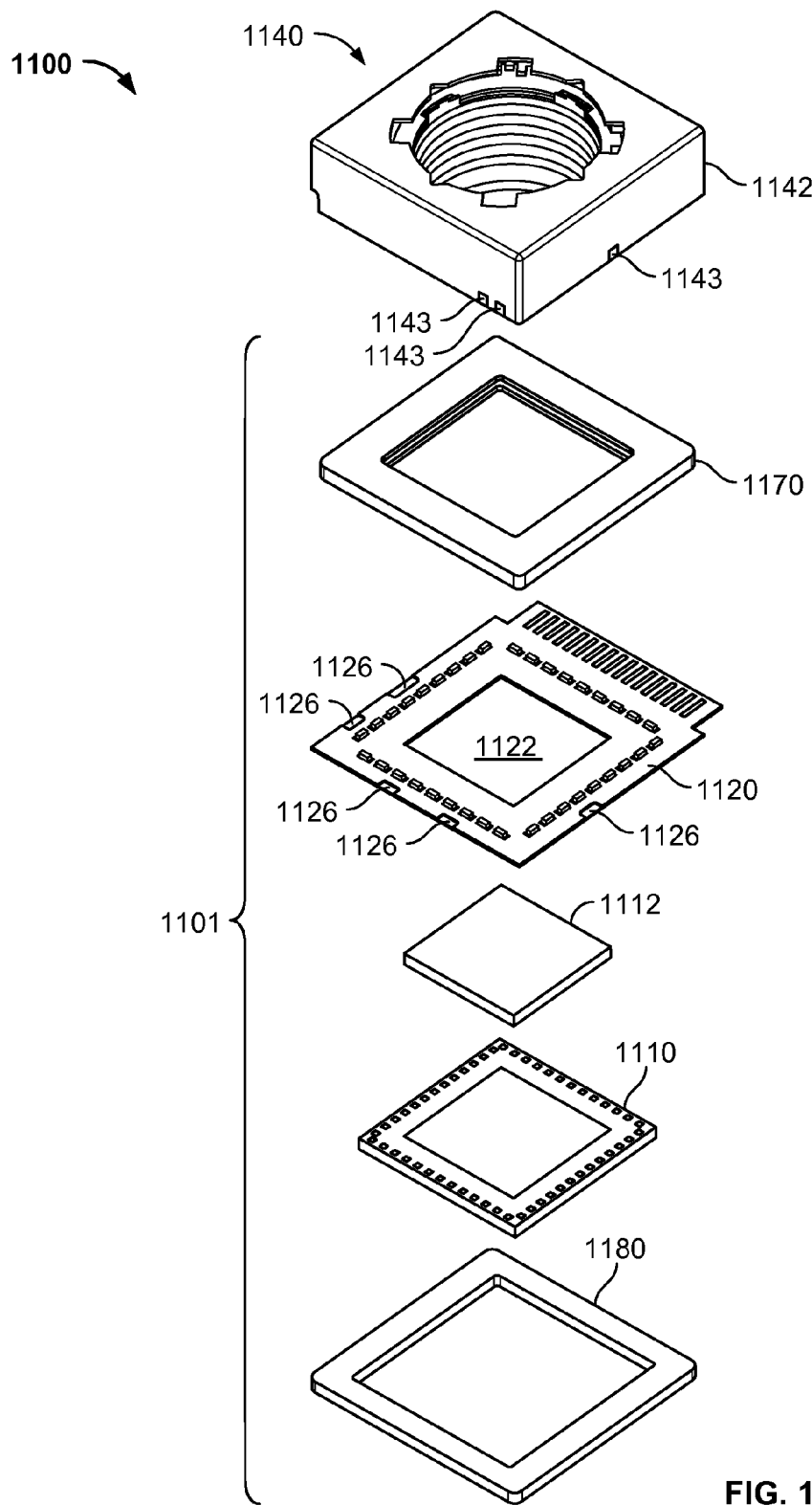
FIG. 11 is an exploded perspective view of a camera module with an image sensor die positioned in a substrate assembly having dual stiffener members, in accordance with embodiments of the present invention.

FIG. 11 is an exploded perspective view of a camera module 1100 with an image sensor die positioned in a substrate assembly having dual stiffener members, in accordance with other embodiments of the present invention. The camera module 1100 comprises an image sensor module 1101 and a lens module 1140. The image sensor module 1101 comprises an image sensor die 1110, an IR filter 1112, a flexible tape substrate 1120, a first stiffener member 1170, and a second stiffener member 1180. The lens module 1140 is similar to the lens module 140 described above and comprises an autofocus lens housing 1142 forming a cavity containing one or more lenses.

The substrate 1120 may comprise any form of circuit substrate suitable to provide the necessary interconnection structure for operation of the camera module 1100, as is well known in the art. The substrate 1120 may comprise, for example, a flexible high density interconnect (HDI) polyimide tape substrate. The substrate 1120 includes an image sensor opening 1122, which exposes the image sensor die 1110 to the light received by the lens module 1140.

Figure 12:
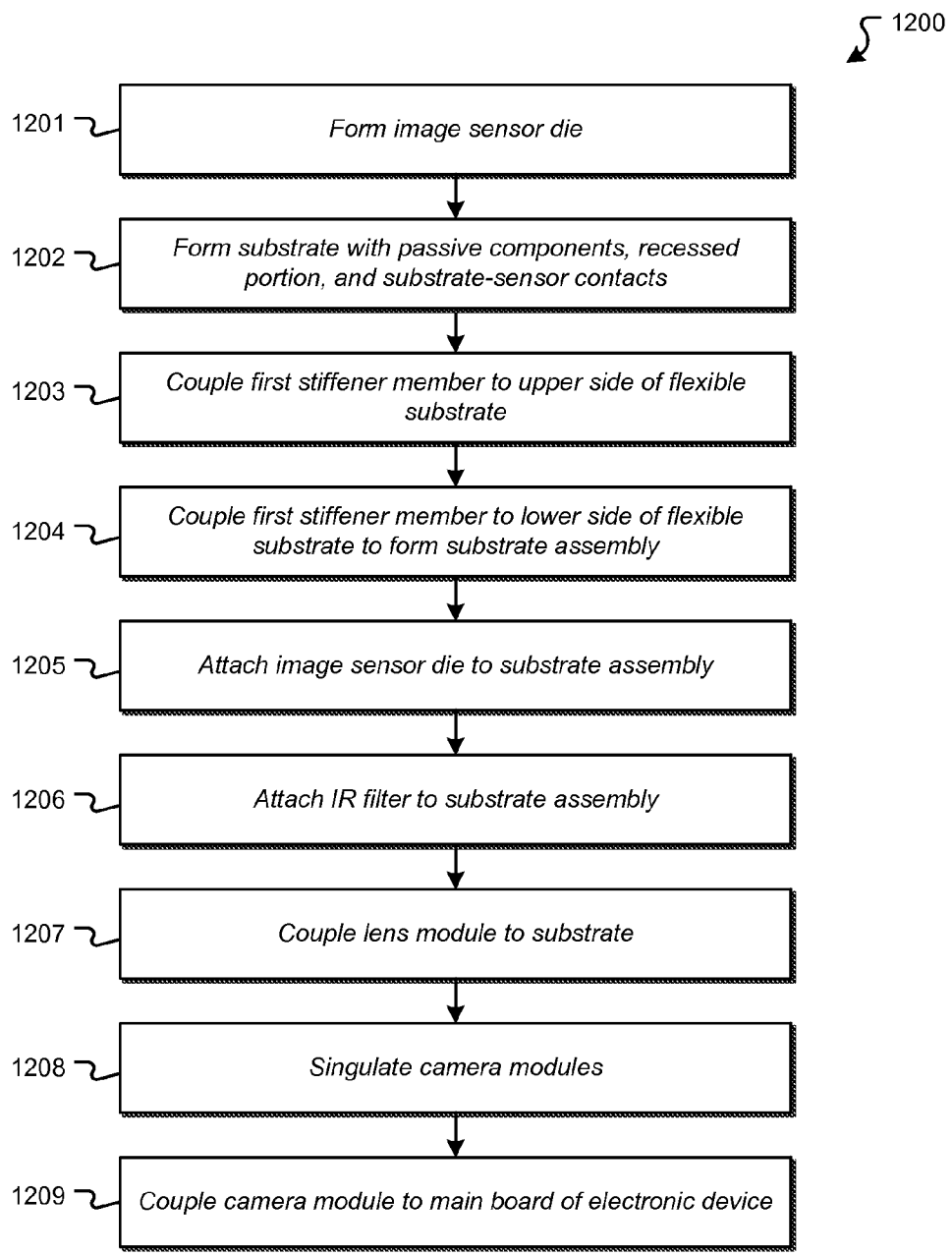
FIG. 12 is a flowchart illustrating a method of manufacturing a camera assembly with an image sensor die positioned in a substrate assembly having dual stiffener members, in accordance with embodiments of the present invention.

FIG. 12 is a flowchart illustrating a method 1200 of manufacturing a camera assembly 1100 with an image sensor die 1110 positioned in a substrate assembly having dual stiffener members 1170, 1180, in accordance with embodiments of the present invention. FIGS. 13A-13K illustrate various steps in the manufacturing method 1200.

In step 1201, shown in FIG. 13A, the image sensor die 1110 is formed. Before each image sensor die 1110 is singulated from the wafer 1300 held in the wafer carrier 1302, a plurality of die contacts 1111 are formed on the upper surface of each image sensor die 1110. The die contacts 1111 can be formed in a variety of ways, depending on the desired method of coupling the image sensor die 1110 to the substrate 1120. In some embodiments, the die contacts 1111 may comprise gold stud bumps. Alternatively, the die contacts 1111 may comprise any other type of suitable material and form, such as, e.g., sputter plated bumps, gold plated bumps, or copper pillar bumps.

Figure 13C:
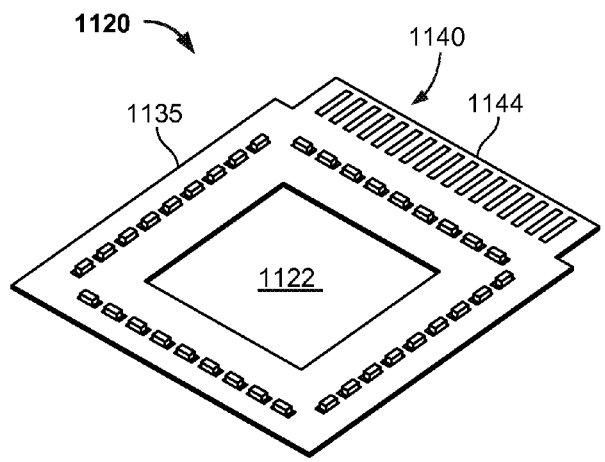

In step 1202, shown in FIGS. 13B-13C, a plurality of flexible tape substrates 1120 are provided in a substrate strip array 1310. The upper side 1121a of each substrate 1320 includes a plurality of component contacts 1134 around the periphery of the image sensor opening 1122. Electronic components 1135 may be coupled to each of these contacts 1134 using surface mount technology (SMT). A plurality of lens module connections (not shown) may be provided along the outer edges of the substrate 1120 for coupling with corresponding contacts (not shown) in the lens housing 1142. These lens module connections may be used to provide power, ground, and control signals to the lens module 1140. The various contacts provided on the substrate 1120 may be formed, e.g., using electroless nickel immersion gold (ENIG) plating techniques.

The upper side 1121a of the flexible substrate 1120 includes a main board contact region 1140. The main board contact region 1140 includes a plurality of LGA pads 1144 which may be coupled to main board contacts on the main board of the electronic device. The LGA pads 1144 receive all of the power and I/O signals required for operation of the camera module 1100. The LGA pads 1144 can be bonded (e.g., soldered) directly to corresponding contacts on the main board or to an intermediate interposer structure, such as a cable or circuit board, which is coupled to the main board.

The lower side 1121b of the flexible substrate 1120 (shown in FIG. 13E) includes a die contact region around the periphery of the image sensor opening 1122. The die contact region comprises a plurality of substrate-sensor contacts 1129 for bonding with the die contacts 1111 on the image die sensor 1110.

Figure 13D:
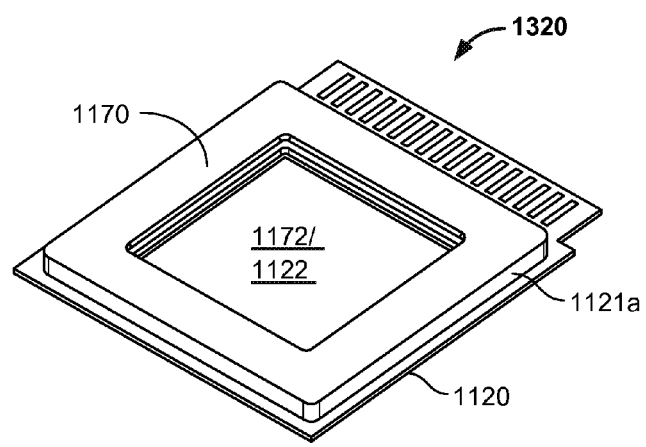

In step 1203, shown in FIG. 13D, a first molded stiffener member 1170 is coupled to the upper side 1121a of the flexible substrate 1120. In step 1204, shown in FIG. 13E, a second molded stiffener member 1180 is coupled to the lower side 1121b of the flexible substrate 1120. The first molded stiffener member 1170, the flexible substrate 1120, and the second molded stiffener member 1180 form a substrate assembly 1320. The molded stiffener members 1170, 1180 may comprise any of a variety of transfer molding materials well-known in the semiconductor packaging industry. The first stiffener member 1170 encapsulates the electronic components 1135 and defines a first stiffener opening 1172 exposing the image sensor opening 1122.

The second stiffener member 1170 defines a second stiffener opening 1182 exposing the image sensor opening 1122 and the plurality of substrate-sensor contacts 1129 in the die contact region on the lower side 1121b of the flexible substrate 1120. Unlike traditional semiconductor packaging applications, the second molded stiffener member 1180 is not used in the camera module 1100 to encapsulate and protect electronic devices. Instead, the molded stiffener member 1180 is used to provide a rigid, planar support to the flexible tape substrate 1120 and to protect the die from damage. The transfer molding material can be advantageous in this application because its manufacturing processes are well known and relatively inexpensive, and its physical characteristics are well documented.

Figure 13E:
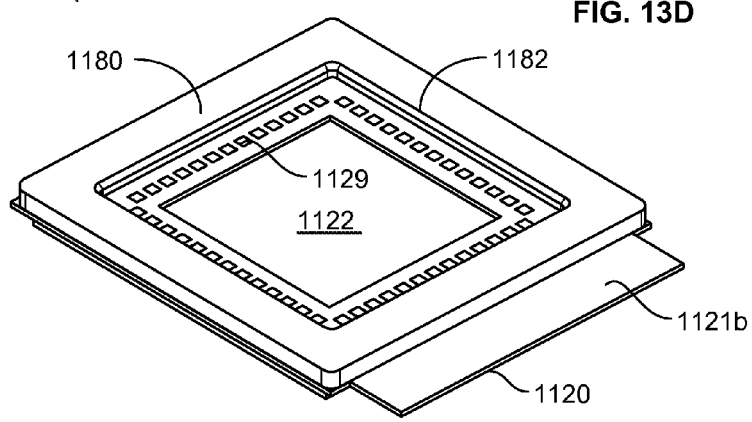
Figure 13F:
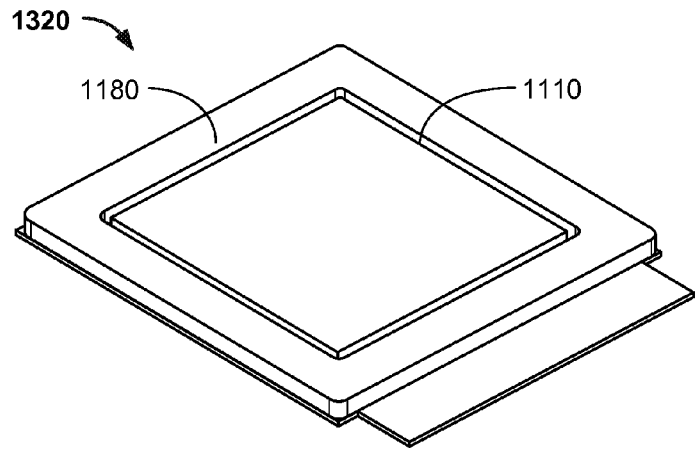
Figure 13G:
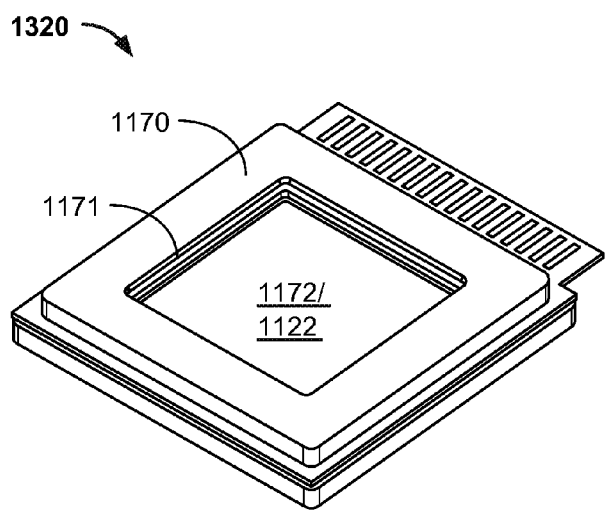

In step 1205, shown in FIGS. 13F-13G, the image sensor die 1110 is attached to the substrate assembly 1320, using, for example, an epoxy adhesive. FIG. 13F shows a perspective view of the lower side of the substrate assembly 1320. FIG. 13G shows a perspective view of the upper side of the substrate assembly 1320, where it can be seen that the photosensor portion of the image sensor die 1110 is exposed by the first stiffener opening 1172 and the image sensor opening 1122.

In the illustrated embodiment, the second stiffener opening 1182 is larger than the image sensor die 1110, so the image sensor die 1110 is positioned entirely within the second stiffener opening 1182 and is bonded entirely to the flexible substrate 1120 without the second stiffener member 1180 interposed between the die 1110 and the flexible substrate 1120, thereby slightly reducing the overall height of the camera module 1100.

The bonding of the image sensor die 1110 to the flexible substrate 1120 may be performed in a variety of ways. Because the plurality of substrate-sensor contacts 1129 are exposed by the second stiffener opening 1182, the image sensor die 1110 may be flip-chip bonded to the flexible substrate 1120. The plurality of die contacts 1111 on the image sensor die 1110 may be formed as gold stud bump die contacts 1111, and the plurality of substrate-sensor contacts 1129 may be formed as land pad contacts 1129. In one embodiment, flip chip bonding using a conductive epoxy process followed by a jetting unfill process may be used. In another embodiment, flip chip bonding using a thermal ultrasonic (T/S) bonding process to form an inter-metallic coverage (IMC) between the die contacts 1111 and substrate-sensor contacts 1129 followed by a jetting unfill process may be used. In another embodiment, flip chip bonding using a thermal-compression (T/C) bonding process with a non-conductive paste (NCP) dispensed on the substrate-sensor contacts 1129 may be used. In another embodiment, flip chip bonding of plated bump die contacts 1111 using a T/C bonding process with an anisotropic conductive paste (ACP) dispensed on the substrate-sensor contacts 1129 may be used.

Figure 13H:
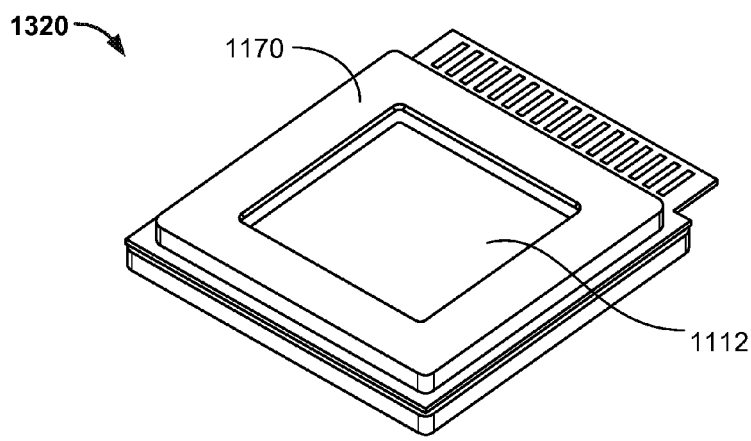

In step 1206, shown in FIG. 13H, the IR filter 1112 is attached to the substrate assembly 1320. In some embodiments, the first stiffener member 1170 includes a ridge portion 1171 for coupling with and supporting the IR filter 1112. In other embodiments, the IR filter 1112 may be coupled directly to the upper surface of the image sensor die 1110.

Figure 13I:
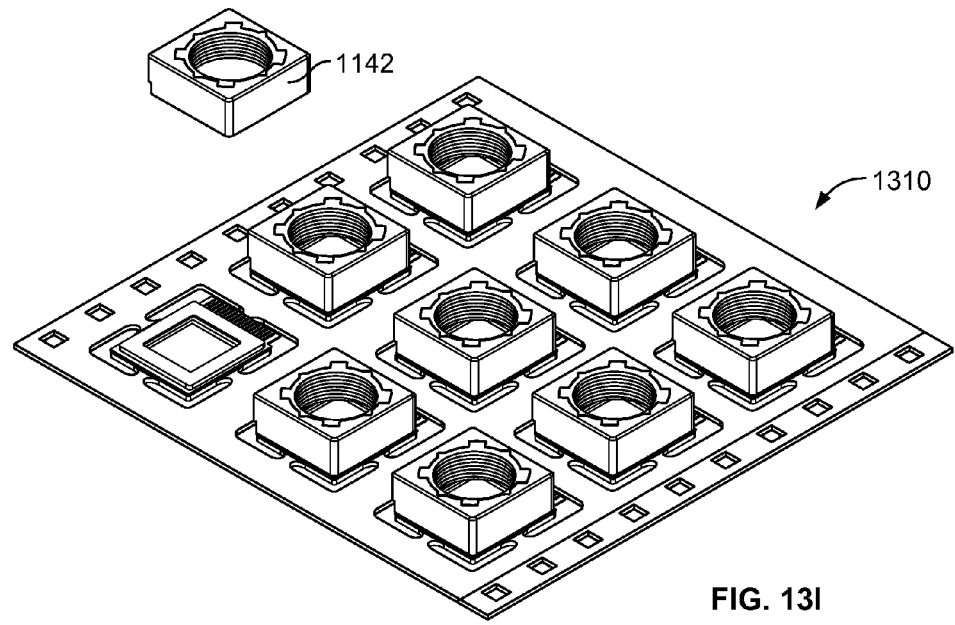

In step 1207, shown in FIG. 13I, the lens housing 1142 is coupled to each of the substrate assemblies 1320 in the panel format strip array 1310. The lens housing 1142 may be attached to the substrate assemblies 1320 by depositing an adhesive, such as an epoxy adhesive, onto a portion of the substrate assembly 1320 not otherwise used for electrical connections. The lens module connections (not shown) on the substrate assembly 1320 may then be coupled to the corresponding contacts (not shown) in the lens housing 1142 using, for example, conventional soldering methods.

In step 1208, shown in FIG. 10J, each camera module 1100 may then be singulated from the strip array 1310 for integration with an electronic device, such as computing device 200.

In step 1208, the camera module 1100 is coupled to the main board of the electronic device to form a completed camera assembly. This may be accomplished using any of a variety of known methods. The upper side 1121a of the substrate assembly 1020 includes a main board contact region 1040, which may extend beyond the first and second stiffener members 1170, 1180, as shown in FIGS. 13D-13E. The region directly underneath the extending main board contact region 1040 may provide clearance for other components in the device. The main board contact region 1140 includes a plurality of LGA pads 1144 which may be coupled to main board contacts on the main board of the electronic device. The LGA pads 1144 receive all of the power and I/O signals required for operation of the camera module 1100. The LGA pads 1144 can be bonded (e.g., soldered) directly to corresponding contacts on the main board or to an intermediate interposer structure, such as a cable or circuit board, which is coupled to the main board.

Figure 13J:
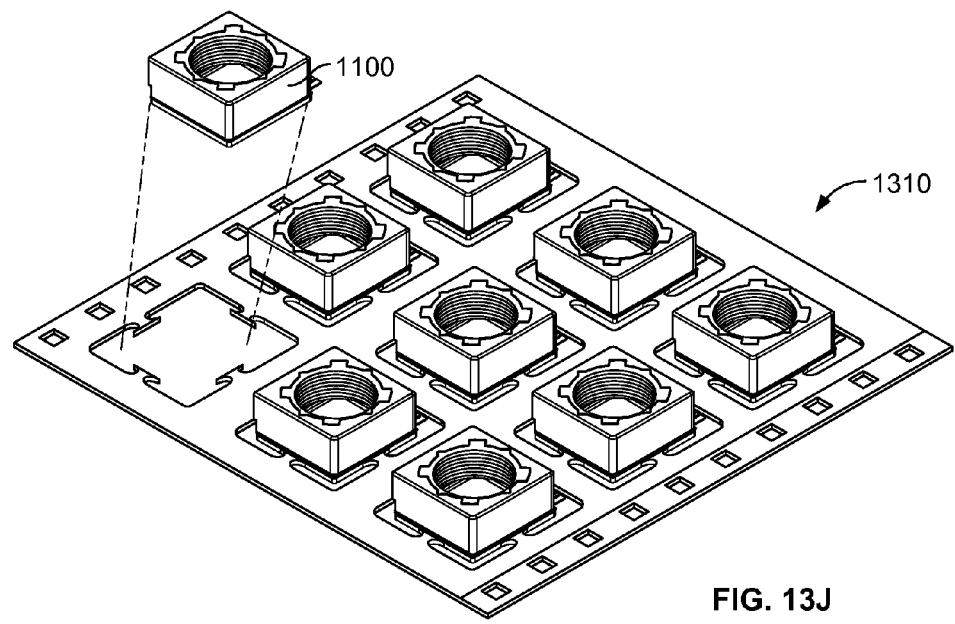
Figure 13K:
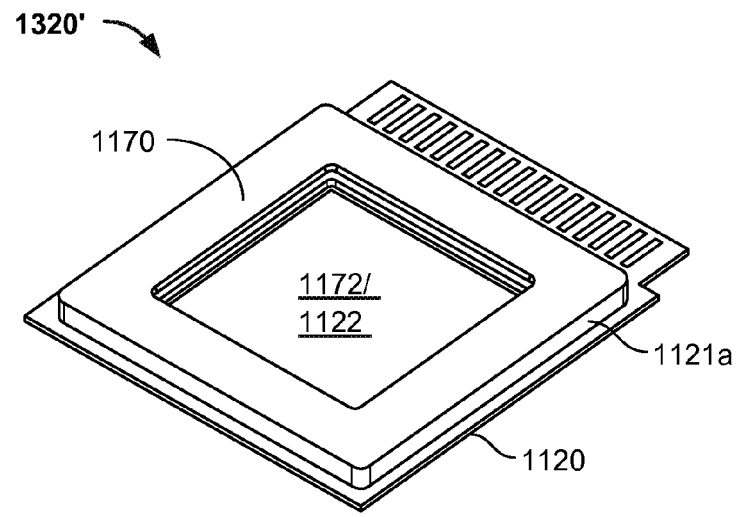
Figure 13L:
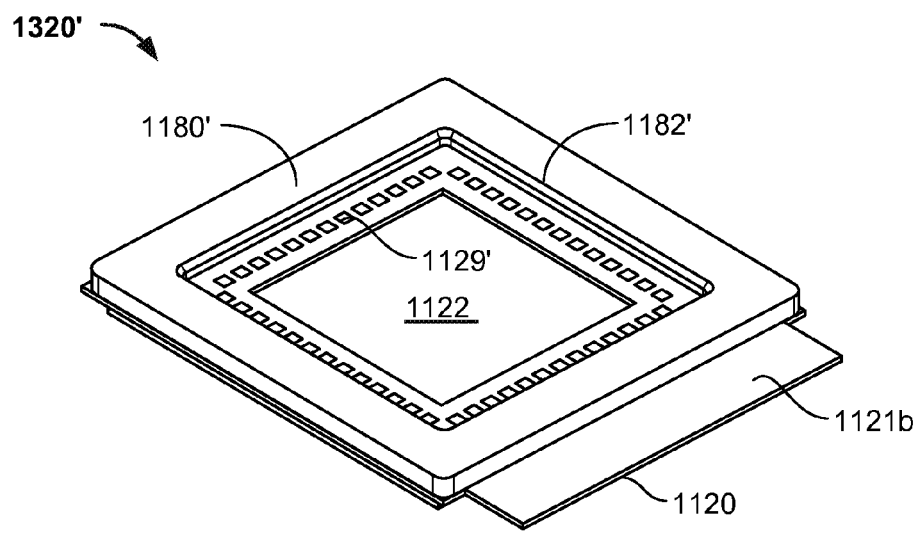

FIGS. 13J-13K show upper and lower perspective views of a substrate assembly 1320' in accordance with another embodiment. As shown in FIG. 13D, a first molded stiffener member 1170 is coupled to the upper side 1121a of the flexible substrate 1120. However, in place of the second molded stiffener member 1180, a second rigid stiffener member 1180' is coupled to the lower side 1121b of the flexible substrate 1120. The first molded stiffener member 1170, the flexible substrate 1120, and the second rigid stiffener member 1180' form a substrate assembly 1320'. The second stiffener member 1180' may comprise any rigid material, such as a metallic, composite, polymer, or laminate, that is rigid prior to coupling with the flexible substrate 1120.

It will be understood that in other embodiments, the type, arrangement, and manufacturing steps for the various components of the camera assembly may vary. For example, as illustrated in FIGS. 13C-13D, the electronic components 1135 are mounted on the substrate assembly 1120 along all four edges of the image sensor opening 1122. In other embodiments, the electronic components 1135 may be mounted on fewer than four edges or may be positioned elsewhere in the camera module 1100. In addition, the contacts for power and I/O with the main board need not be provided in an LGA fan-out main board contact region 1140. These contacts may be formed using any of the contact techniques described herein or known by one of ordinary skill in the art.

The above-described embodiments may achieve a number of advantages over conventional camera module designs. The overall size of the camera module may be reduced. Because HDI tape substrates provide much higher line pitch than conventional laminate substrates, the use of HDI tape substrates can enable a reduction in the number of layers necessary for the interconnect structure of the substrate. The use of a thin flexible tape substrate enables a thinner interconnect structure for the substrate, thereby reducing height. The molded stiffener members can provide sufficient rigidity to maintain structural support for the camera module, provide protection to the electrical components mounted on the flexible substrate opposite the image sensor die, and provide protection to the image sensor die.

The footprint of the camera module (i.e., the width and length) may be minimized as a result of placing the passive components on the upper side of the substrate around the periphery of the image sensor opening directly opposite from the flip-chip-bonded substrate-sensor contacts on the bottom side of the substrate and within the cavity of the lens housing.

The use of flip-chip bonding techniques to attach the image sensor die can enable the use of a single stud bump, which is less expensive than the use of a stud bump and gold wire bonding. In addition, when performing flip-chip bonding of an image sensor die to a ceramic or laminate substrate, gang pressing techniques for performing thermal compression bonding may not be possible due to the non-planarity of the ceramic or laminate substrate, which could result in undesirable tilting of the image sensor die. Embodiments of the present invention utilize flexible tape with a molded stiffener to provide extremely planar surfaces suitable for gang press bonding of the image sensor dice to the substrate assemblies.

Finally, the ability to perform numerous steps in the manufacturing process while the substrate assemblies remain in strip array format can enable more efficient batch processing, thereby reducing the cost per unit. Flexible tape substrates may be provided in even larger strips than conventional ceramic and laminate strip arrays, thereby increasing the number of camera modules that may be manufactured in each batch, resulting in an improvement in the manufacturing units per hour (UPH).

Figure 14:
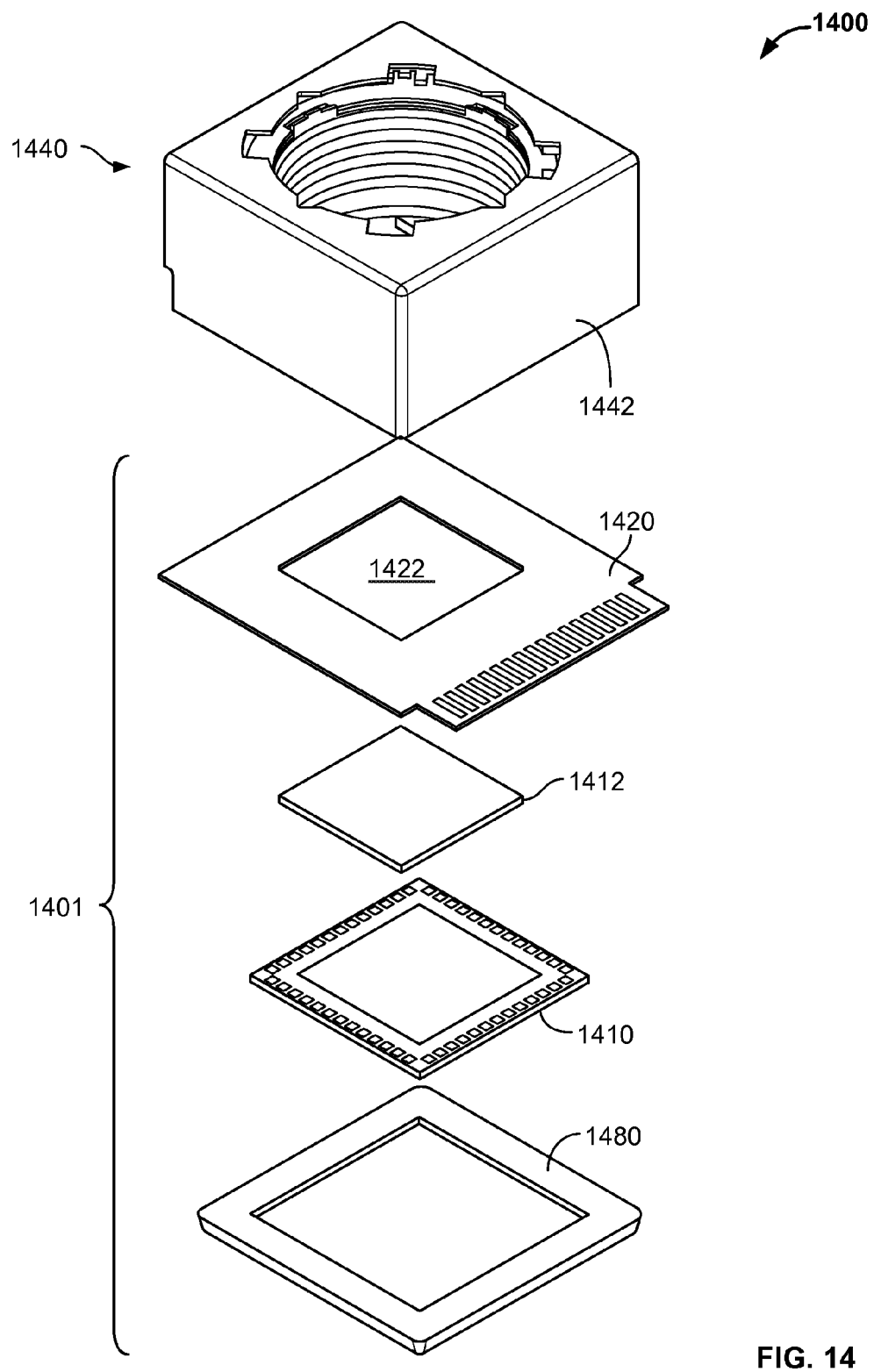
FIG. 14 is an exploded perspective view of a camera module with an encapsulated image sensor die, in accordance with embodiments of the present invention.
Figure 15:
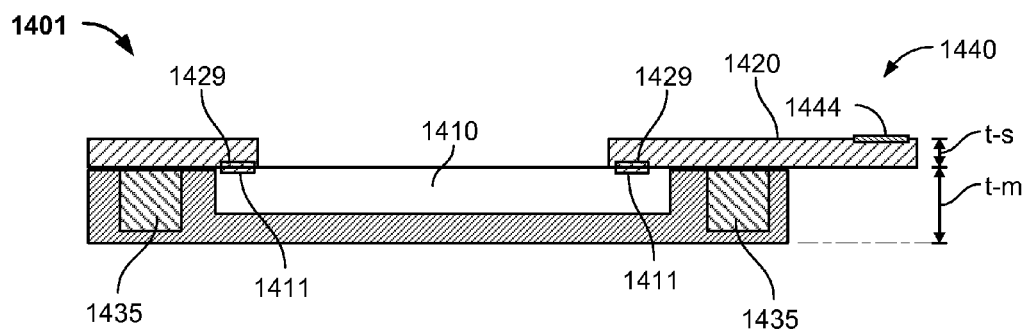
FIG. 15 is a cross-sectional view of an image sensor module, in accordance with embodiments of the present invention.

FIG. 14 is an exploded perspective view of a camera module 1400 with an encapsulated image sensor die, in accordance with other embodiments of the present invention. FIG. 15 is a cross-sectional view of the image sensor module 1401. The image sensor module 1401 comprises an image sensor die 1410, a substrate 1420, and electronic components 1435. The lens module 1440 is similar to the lens module 140 described above and comprises an autofocus lens housing 1442 forming a cavity containing one or more lenses.

The camera module 1400 comprises an image sensor module 1401 and a lens module 1440. The image sensor module 1101 comprises an image sensor die 1110, an IR filter 1112, a flexible tape substrate 1120, and a stiffener member 1480. The lens module 1440 is similar to the lens module 140 described above and comprises an autofocus lens housing 1442 forming a cavity containing one or more lenses.

The substrate 1420 may comprise any form of circuit substrate suitable to provide the necessary interconnection structure for operation of the camera module 1400, as is well known in the art. The substrate 1420 may comprise, for example, a flexible HDI polyimide tape substrate. The substrate 1420 includes an image sensor opening 1422, which exposes the image sensor die 1410 to the light received by the lens module 1440.

Figure 16:
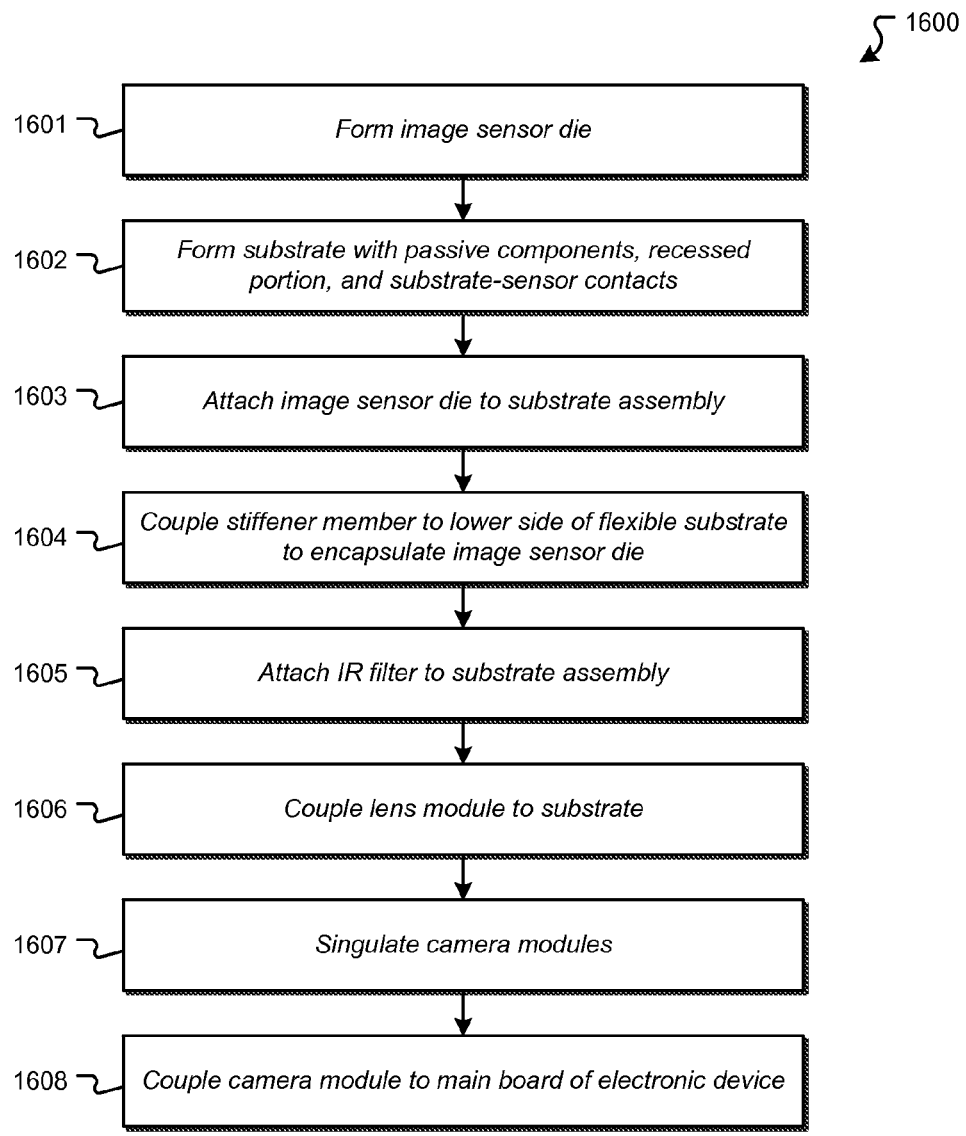
FIG. 16 is a flowchart illustrating a method of manufacturing a camera assembly with an image sensor die encapsulated by a molded stiffener member, in accordance with embodiments of the present invention.

FIG. 16 is a flowchart illustrating a method 1600 of manufacturing a camera assembly 1400 with an image sensor die 1410 encapsulated by a molded stiffener member 1480, in accordance with embodiments of the present invention. FIGS. 17A-17E illustrate various steps in the manufacturing method 1600.

In step 1601, shown in FIG. 13A, the image sensor die 1410 is formed. The image sensor die 1410 and die contacts 1411 may be formed in the same way as the image sensor die 1110 and die contacts 1111 shown in FIG. 13A.

In step 1602, shown in FIGS. 17A-17B, a plurality of flexible tape substrates 1420 are provided in a substrate strip array 1710. The lower side 1421*b* of each substrate 1420 includes a plurality of component contacts 1434 around the periphery of the image sensor opening 1422. Electronic components 1435 may be coupled to each of these contacts 1434 using surface mount technology (SMT). The lower side 1421*b* of the flexible substrate 1420 also includes a die contact region around the periphery of the image sensor opening 1422. The die contact region comprises a plurality of substrate-sensor contacts 1429 for bonding with the die contacts 1411 on the image die sensor 1410.

Figure 17E:
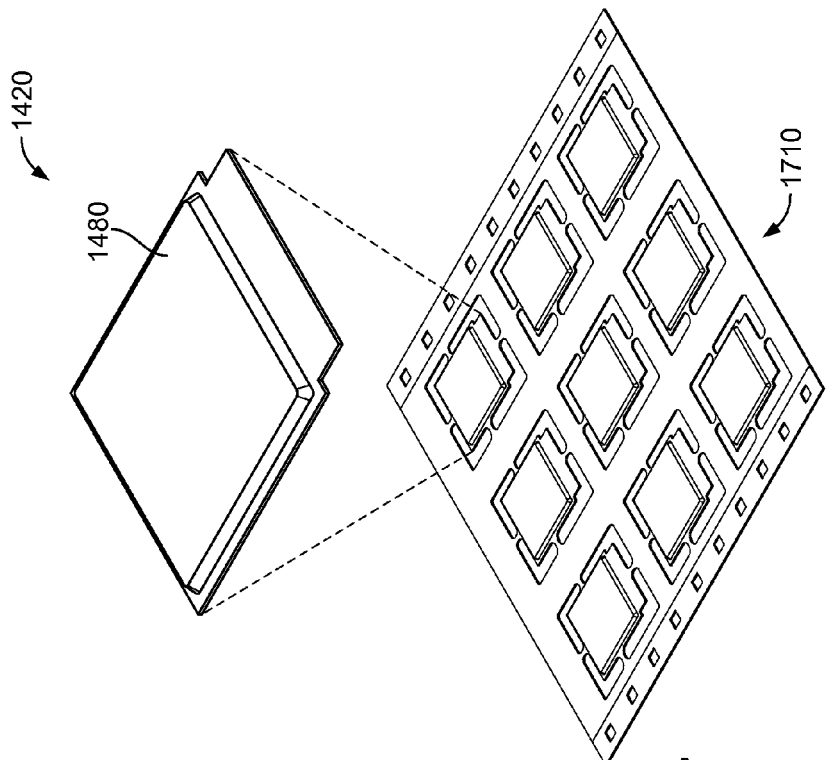
Figure 17D:
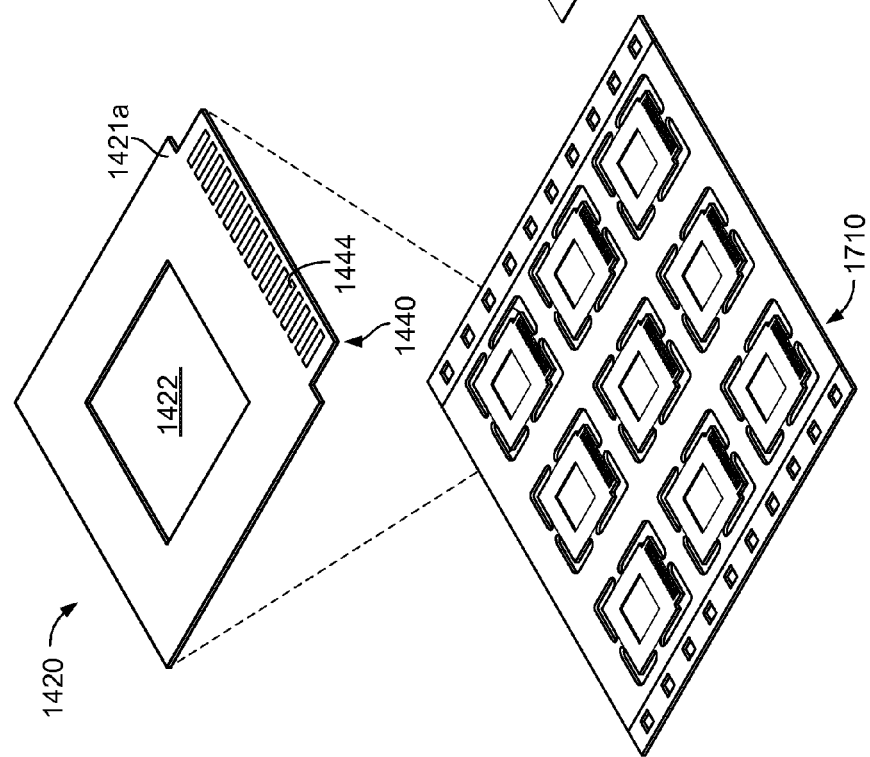

In step 1603, shown in FIGS. 17C-17D, the image sensor die 1410 is attached to the lower side 1421*b* of the substrate assembly 1420, using, for example, an epoxy adhesive. The electronic components 1435 surround the periphery of the image sensor die 1410. The bonding of the image sensor die 1410 to the flexible substrate 1420 may be performed in a variety of ways. In the illustrated embodiment, the image sensor die 1410 is flip-chip bonded to the flexible substrate 1420. The plurality of die contacts 1411 on the image sensor die 1410 may be formed as gold stud bump die contacts 1410, and the plurality of substrate-sensor contacts 1429 may be formed as land pad contacts 1429. In one embodiment, flip chip bonding using a conductive epoxy process followed by a jetting unfill process may be used. In another embodiment, flip chip bonding using a thermal ultrasonic (T/S) bonding process to form an inter-metallic coverage (IMC) between the die contacts 1411 and substrate-sensor contacts 1429 followed by a jetting unfill process may be used. In another embodiment, flip chip bonding using a thermal-compression (T/C) bonding process with a non-conductive paste (NCP) dispensed on the substrate-sensor contacts 1429 may be used. In another embodiment, flip chip bonding of plated bump die contacts 1411 using a T/C bonding process with an anisotropic conductive paste (ACP) dispensed on the substrate-sensor contacts 1429 may be used.

FIG. 17D shows the upper side 1421*a* of the flexible substrate 1420 with the image sensor die 1410 attached. As can be seen in FIG. 17D, the photosensor portion of the image sensor die 1410 is exposed by the image sensor opening 1422. The flexible substrate 1420 includes a main board contact region 1440. The main board contact region 1440 includes a plurality of LGA pads 1444 which may be coupled to main board contacts on the main board of the electronic device. The LGA pads 1444 receive all of the power and I/O signals required for operation of the camera module 1400. The LGA pads 1444 can be bonded (e.g., soldered) directly to corresponding contacts on the main board or to an intermediate interposer structure, such as a cable or circuit board, which is coupled to the main board.

A plurality of lens module connections (not shown) may be provided along the outer edges of the substrate 1420 for coupling with corresponding contacts (not shown) in the lens housing 1442. These lens module connections may be used to provide power, ground, and control signals to the lens module 1440. The various contacts provided on the substrate 1420 may be formed, e.g., using electroless nickel immersion gold (ENIG) plating techniques.

In step 1604, shown in FIG. 17E, a molded stiffener member 1470 is coupled to the lower side 1421*b* of the flexible substrate 1420 to encapsulate the image sensor die 1410 and the electronic components 1435. The stiffener member 1470 may comprise any of a variety of transfer molding materials well-known in the semiconductor packaging industry.

In step 1605, the IR filter 1412 is attached to the flexible substrate 1420.

In step 1606, the lens housing 1442 is coupled to each of the substrates 1720 in the panel format strip array 1710. The lens housing 1442 may be attached to the substrate assemblies 1420 by depositing an adhesive, such as an epoxy adhesive, onto a portion of the substrate assembly 1420 not otherwise used for electrical connections. The lens module connections (not shown) on the substrate assembly 1420 may then be coupled to the corresponding contacts (not shown) in the lens housing 1442 using, for example, conventional soldering methods.

In step 1607, shown in FIG. 10J, each camera module 1400 may then be singulated from the strip array 1310 for integration with an electronic device, such as computing device 200.

In step 1608, the camera module 1400 is coupled to the main board of the electronic device to form a completed camera assembly. This may be accomplished using any of a variety of known methods. The upper side 1421*a* of the substrate assembly 1420 includes a main board contact region 1440. The main board contact region 1440 includes a plurality of LGA pads 1444 which may be coupled to main board contacts on the main board of the electronic device. The LGA pads 1444 receive all of the power and I/O signals required for operation of the camera module 1400. The LGA pads 1444 can be bonded (e.g., soldered) directly to corresponding contacts on the main board or to an intermediate interposer structure, such as a cable or circuit board, which is coupled to the main board.

It will be understood that in other embodiments, the type, arrangement, and manufacturing steps for the various components of the camera assembly may vary. For example, as illustrated in FIGS. 17B-17C, the electronic components 1435 are mounted on the substrate assembly 1420 along all four edges of the image sensor opening 1422. In other embodiments, the electronic components 1435 may be mounted on fewer than four edges or may be positioned elsewhere in the camera module 1400. In addition, the contacts for power and I/O with the main board need not be provided in an LGA fan-out main board contact region 1440. These contacts may be formed using any of the contact techniques described herein or known by one of ordinary skill in the art.

The above-described embodiments may achieve a number of advantages over conventional camera module designs. The overall size of the camera module may be reduced. Because HDI tape substrates provide much higher line pitch than conventional laminate substrates, the use of HDI tape substrates can enable a reduction in the number of layers necessary for the interconnect structure of the substrate. The use of a thin flexible tape substrate enables a thinner interconnect structure for the substrate, thereby reducing height. The molded stiffener members can provide sufficient rigidity to maintain structural support for the camera module, provide protection to the electrical components mounted on the flexible substrate opposite the image sensor die, and provide protection to the image sensor die.

The footprint of the camera module (i.e., the width and length) may be minimized as a result of utilizing flip-chip bonding techniques to attach the image sensor die. In addition, flip-chip bonding can enable the use of a single stud bump, which is less expensive than the use of a stud bump and gold wire bonding. When performing flip-chip bonding of an image sensor die to a ceramic or laminate substrate, gang pressing techniques for performing thermal compression bonding may not be possible due to the non-planarity of the ceramic or laminate substrate, which could result in undesirable tilting of the image sensor die. Embodiments of the present invention utilize flexible tape which may be positioned against a planar surface to provide a surface suitable for gang press bonding of the image sensor dice to the flexible tape substrate. In this case, it may be desirable to position the electrical components on the same side as the image sensor die, so as to provide a fully planar surface against which the image sensor die can be compressed.

Finally, the ability to perform numerous steps in the manufacturing process while the substrate assemblies remain in strip array format can enable more efficient batch processing, thereby reducing the cost per unit. Flexible tape substrates may be provided in even larger strips than conventional ceramic and laminate strip arrays, thereby increasing the number of camera modules that may be manufactured in each batch, resulting in an improvement in the manufacturing units per hour (UPH).

Figure 18:
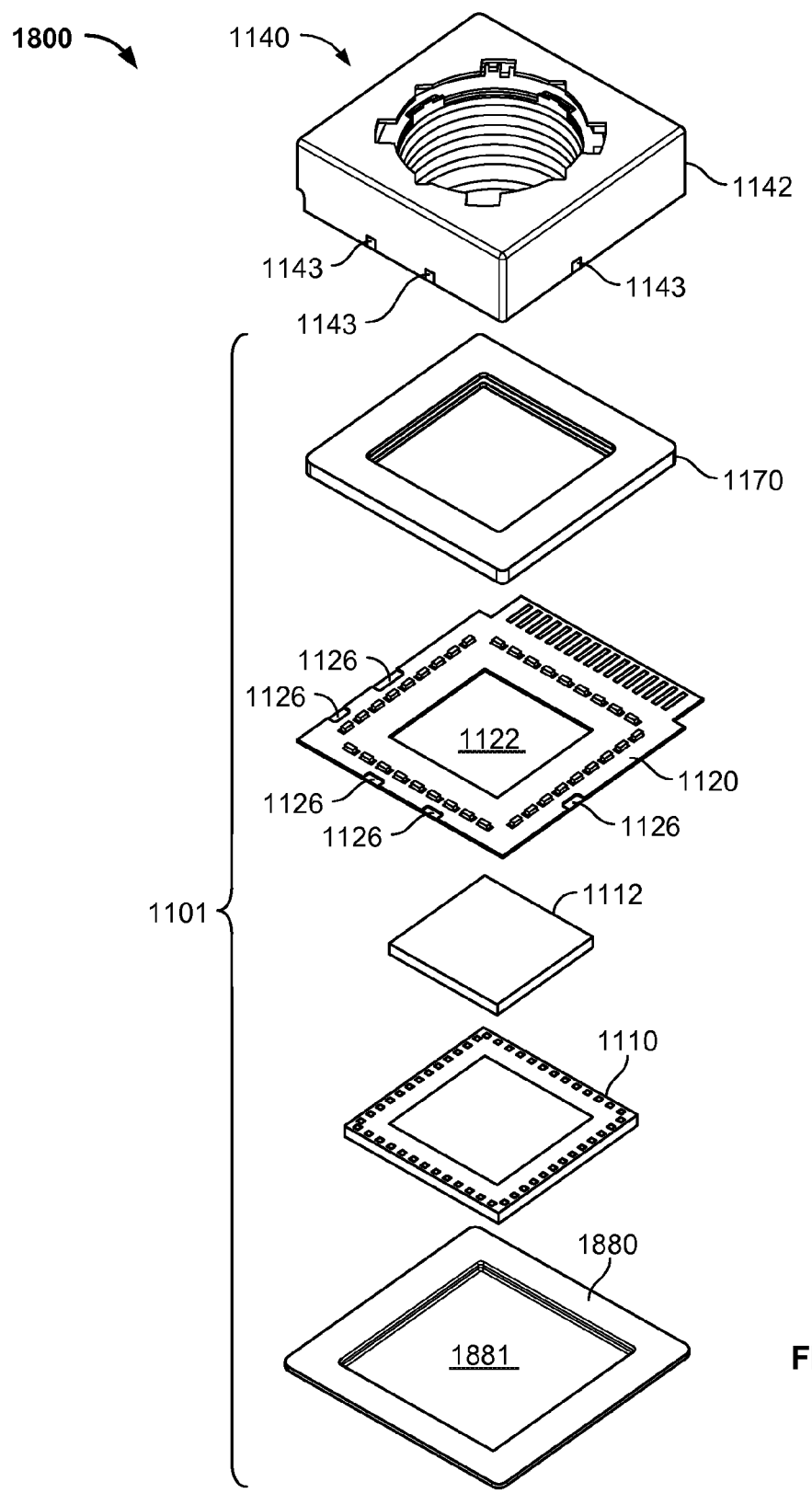
FIG. 18 is an exploded perspective view of a camera module with an image sensor die positioned in a substrate assembly having dual stiffener members, in accordance with embodiments of the present invention.

FIG. 18 is an exploded perspective view of a camera module 1800 with an image sensor die positioned in a substrate assembly having dual stiffener members, in accordance with other embodiments of the present invention. The camera module 1800 is substantially similar to the camera module 1100 described above with respect to FIG. 11, except that the second molded stiffener member 1180 is replaced by a second rigid stiffener member 1880. The second stiffener member 1880 may comprise any rigid material, such as a metallic, composite, polymer, or laminate, that is rigid prior to coupling with the flexible substrate 1120.

The second stiffener member 1880 may be coupled to a perimeter of the flexible substrate 1120 around the image sensor die 1110. In some embodiments, the second stiffener member 1880 has a surface 1881 in thermal contact with a lower surface of the image sensor die 1110 and comprises a highly thermally conductive material, such as a metal, e.g., stainless steel or aluminum. The thermal contact may be achieved, e.g., by direct contact between the second stiffener member 1880 and the image sensor die 1110, or by interposing a thermally conductive material between the stiffener member 1880 and the image sensor die 1110, such as thermally-conductive paste. Accordingly, the second stiffener member 1880 may provide a heat sink function to draw heat away from the image sensor die 1110 during operation. Alternatively, a thermally conductive paste may be applied between the lower surface of the image sensor die 1110 and the second stiffener member 1880 to provide an adhesive force between the two components in addition to providing thermal conduction from the image sensor die to the second stiffener member 1880.

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another, or may be combined in various ways. All possible combinations and subcombinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. A camera module, comprising:
   a substrate assembly having a lower side and an upper side comprising a die attach region and a component mounting region, wherein the component mounting region comprises a plurality of component contacts surrounding the die attach region, said substrate assembly comprising:
      a flexible substrate comprising a circuit board contact region and a die mounting opening; and
      a molded stiffener member forming the lower side of the substrate assembly;
   an image sensor die coupled to the die attach region of the substrate assembly, said image sensor die comprising a plurality of die contacts wire bonded to the flexible substrate, wherein the image sensor die is positioned in the die mounting opening and bonded to the molded stiffener member;
   a plurality of electronic components, each of the electronic components being coupled to a respective one of the plurality of component contacts; and
   a lens module comprising a lens housing and at least one lens contained in the lens housing, said lens housing being coupled to the upper side of the substrate assembly.

2. The camera module of claim 1, wherein:
   the flexible substrate further comprises a plurality of substrate-sensor contacts surrounding the die attach region; and
   the plurality of die contacts are wire bonded to respective ones of the plurality of substrate-sensor contacts.

3. The camera module of claim 1, wherein the flexible substrate comprises a high density interconnect (HDI) tape substrate.

4. The camera module of claim 1, wherein said circuit board contact region comprises a plurality of land grid array (LGA) pads electrically coupled to the image sensor die.

5. A camera assembly, comprising:
a substrate assembly comprising a first side and a second side, said substrate assembly comprising:
a flexible substrate comprising an opening; and
a stiffener member coupled to the flexible substrate to form the second side of the substrate assembly;
an image sensor die positioned in the opening and bonded to the stiffener member, said image sensor die comprising a plurality of die contacts wire bonded to the flexible substrate; and
a lens module comprising a lens housing and at least one lens contained in the lens housing, said lens housing being coupled to the first side of the substrate assembly.

6. The camera module of claim 5, wherein:
the flexible substrate further comprises a plurality of substrate-sensor contacts; and
the plurality of die contacts are wire bonded to respective ones of the plurality of substrate-sensor contacts.

7. The camera assembly of claim 5, wherein the stiffener member comprises a transfer molding material.

8. The camera assembly of claim 5, wherein the flexible substrate comprises a polyimide tape substrate.

9. The camera assembly of claim 5, further comprising a plurality of electronic components, each of the electronic components being coupled to a respective one of a plurality of component contacts provided on the first side of the substrate assembly.

10. The camera assembly of claim 5, wherein the first side of the substrate assembly further comprises a plurality of land grid array (LGA) pads electrically coupled to the image sensor die.

11. The camera assembly of claim 10, further comprising a circuit board for an electronic device, said circuit board including a plurality of circuit board contacts electrically coupled to the plurality of LGA pads.

12. The camera assembly of claim 11, further comprising an interposer coupling the plurality of LGA pads to the circuit board contacts, said interposer being attached to the LGA pads with an anisotropic conductive adhesive.

13. The camera assembly of claim 5, further comprising a plurality of lens module contacts formed on the first side of the substrate assembly, wherein each of the plurality of lens module contacts is coupled to respective ones of a plurality of housing contacts provided on the lens housing, one or more of the lens module contacts delivering power from the substrate assembly to the lens module and one or more of the lens module contacts delivering control signals from the substrate assembly to the lens module.

14. The camera assembly of claim 5, further comprising an infrared filter positioned adjacent to the image sensor die.

15. A method of forming a camera assembly, comprising:
forming a substrate assembly by attaching a stiffener member to a flexible substrate, wherein the flexible substrate comprises an opening;
coupling a plurality of electronic components to a first side of the substrate assembly;
bonding an image sensor die to the first side of the substrate assembly, said image sensor die comprising a plurality of die contacts and being bonded in the opening to the stiffener member;
wire bonding each of the die contacts to the first side of the substrate assembly;
attaching a lens module to the first side of the substrate assembly.

16. The method of claim 15, wherein:
said flexible substrate comprises a plurality of component contacts and a plurality of substrate-sensor contacts provided on the first side of the substrate assembly;
said coupling the plurality of electronic components to the first side of the substrate assembly comprises coupling the plurality of electronic components to respective ones of the plurality of component contacts; and
said wire bonding each of the die contacts to the first side of the substrate assembly comprises wire bonding each of the die contacts to respective ones of the plurality of substrate-sensor contacts.

17. The method of claim 15, wherein said coupling the plurality of electronic components to respective ones of the plurality of component contacts comprises reflow soldering each of the plurality of electronic components to a respective one of the plurality of component contacts.

18. The method of claim 15, wherein said attaching the stiffener member on the flexible substrate comprises molding a stiffener member to the flexible substrate.

19. The method of claim 15, wherein said attaching the stiffener member on the flexible substrate comprises molding a stiffener member to each flexible substrate in an array of flexible substrates in a substrate tape panel, said method further comprising:
singulating each of the flexible substrates from the array of flexible substrates.

20. The method of claim 15, wherein the flexible substrate comprises a polyimide tape substrate.

\* \* \* \* \*